(12) United States Patent
Lee et al.

(10) Patent No.: US 10,163,929 B2
(45) Date of Patent: Dec. 25, 2018

(54) SEMICONDUCTOR DEVICE INCLUDING BARRIER PATTERN AND METAL PATTERN

(71) Applicant: SK hynix Inc., Gyeonggi-do (KR)

(72) Inventors: Ki Hong Lee, Gyeonggi-do (KR); Duk Eui Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/698,327

(22) Filed: Sep. 7, 2017

(65) Prior Publication Data

US 2018/0012904 A1  Jan. 11, 2018

Related U.S. Application Data

(63) Continuation of application No. 15/255,269, filed on Sep. 2, 2016, now Pat. No. 9,786,682.

(30) Foreign Application Priority Data

Mar. 29, 2016  (KR) ........................ 10-2016-0037710

(51) Int. Cl.
| | | |
|---|---|---|
| *H01L 27/115* | (2017.01) | |
| *H01L 27/11582* | (2017.01) | |
| *H01L 21/311* | (2006.01) | |
| *H01L 27/11556* | (2017.01) | |
| *H01L 27/1157* | (2017.01) | |

(52) U.S. Cl.
CPC ... *H01L 27/11582* (2013.01); *H01L 21/31111* (2013.01); *H01L 27/1157* (2013.01); *H01L 27/11556* (2013.01)

(58) Field of Classification Search
CPC .......... H01L 21/31111; H01L 27/1158; H01L 27/11582
See application file for complete search history.

(56) References Cited

U.S. PATENT DOCUMENTS

| | | | | |
|---|---|---|---|---|
| 7,553,743 | B2* | 6/2009 | Lee | H01L 21/76898 |
| | | | | 257/E21.584 |
| 8,722,525 | B2* | 5/2014 | Sinha | H01L 21/31111 |
| | | | | 257/E21.179 |
| 9,275,909 | B2* | 3/2016 | Jayanti | H01L 21/28282 |
| 9,496,419 | B2* | 11/2016 | Sharangpani | H01L 29/7889 |
| 9,576,966 | B1* | 2/2017 | Peri | H01L 27/115 |
| 2009/0230458 | A1* | 9/2009 | Ishiduki | H01L 27/11565 |
| | | | | 257/324 |
| 2012/0220088 | A1* | 8/2012 | Alsmeier | H01L 27/11551 |
| | | | | 438/261 |
| 2013/0210211 | A1* | 8/2013 | Vereen | H01L 45/08 |
| | | | | 438/382 |

(Continued)

*Primary Examiner* — Scott B Geyer
(74) *Attorney, Agent, or Firm* — IP & T Group LLP

(57) ABSTRACT

The invention is related to a method for manufacturing a semiconductor device having a barrier pattern. The method includes alternately forming first sacrificial layers and insulating layers forming channel patterns penetrating the first sacrificial layers and the insulating layers, and forming a slit penetrating the first sacrificial layers and the insulating layers. In order to form the barrier pattern, the method also includes forming openings by removing the first sacrificial layers through the slit, and respectively forming conductive layers in the openings. The conductive layers include first barrier patterns having inclined inner surfaces and metal patterns in the first barrier patterns.

20 Claims, 24 Drawing Sheets

(56) References Cited

U.S. PATENT DOCUMENTS

| | | | |
|---|---|---|---|
| 2014/0008714 A1* | 1/2014 | Makala | H01L 21/28273 257/324 |
| 2015/0270280 A1* | 9/2015 | Simsek-Ege | H01L 27/11582 257/66 |
| 2015/0311214 A1* | 10/2015 | Yoo | H01L 27/1157 257/326 |
| 2015/0364485 A1* | 12/2015 | Shimura | H01L 27/11556 257/316 |
| 2016/0149049 A1* | 5/2016 | Sharangpani | H01L 29/7889 257/314 |

* cited by examiner

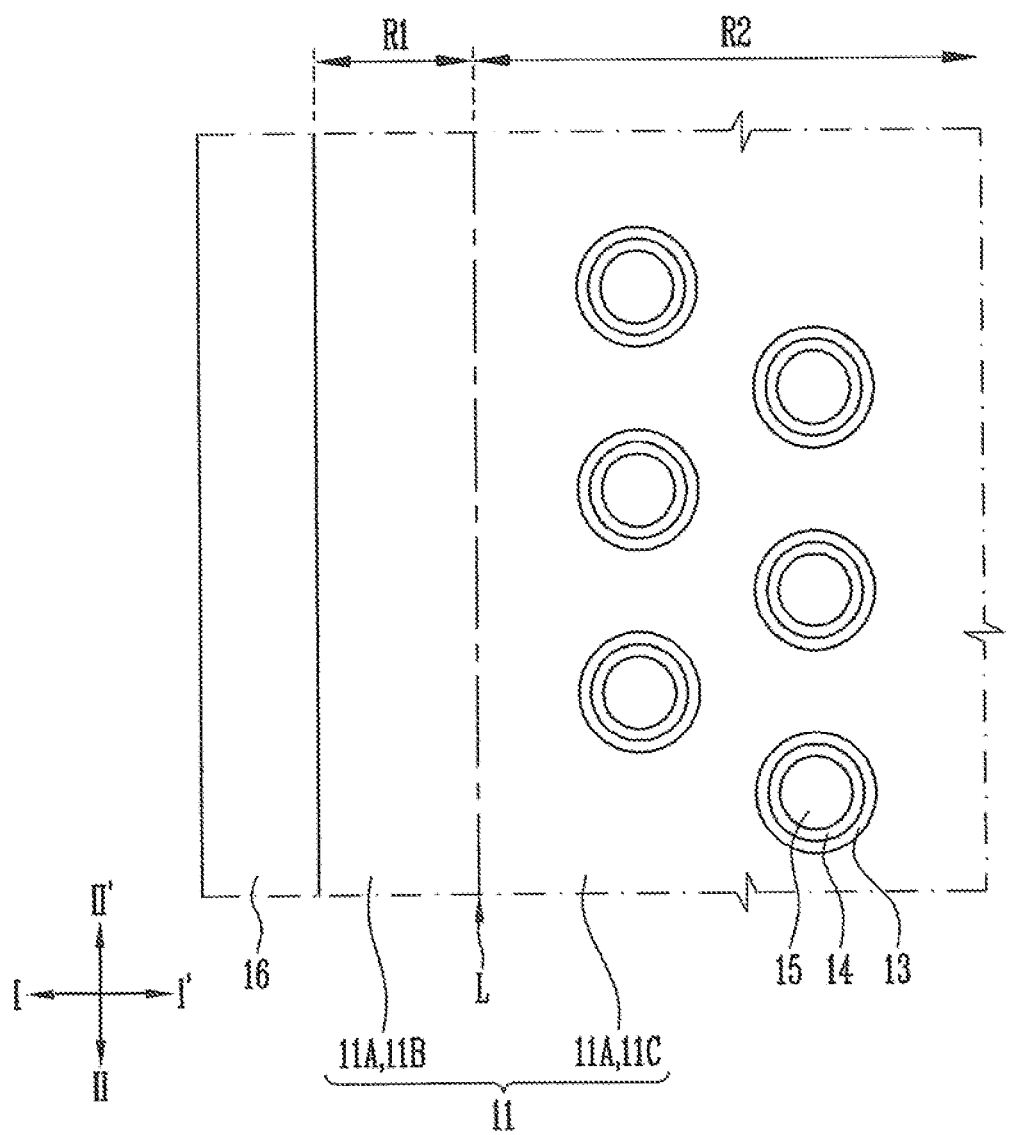

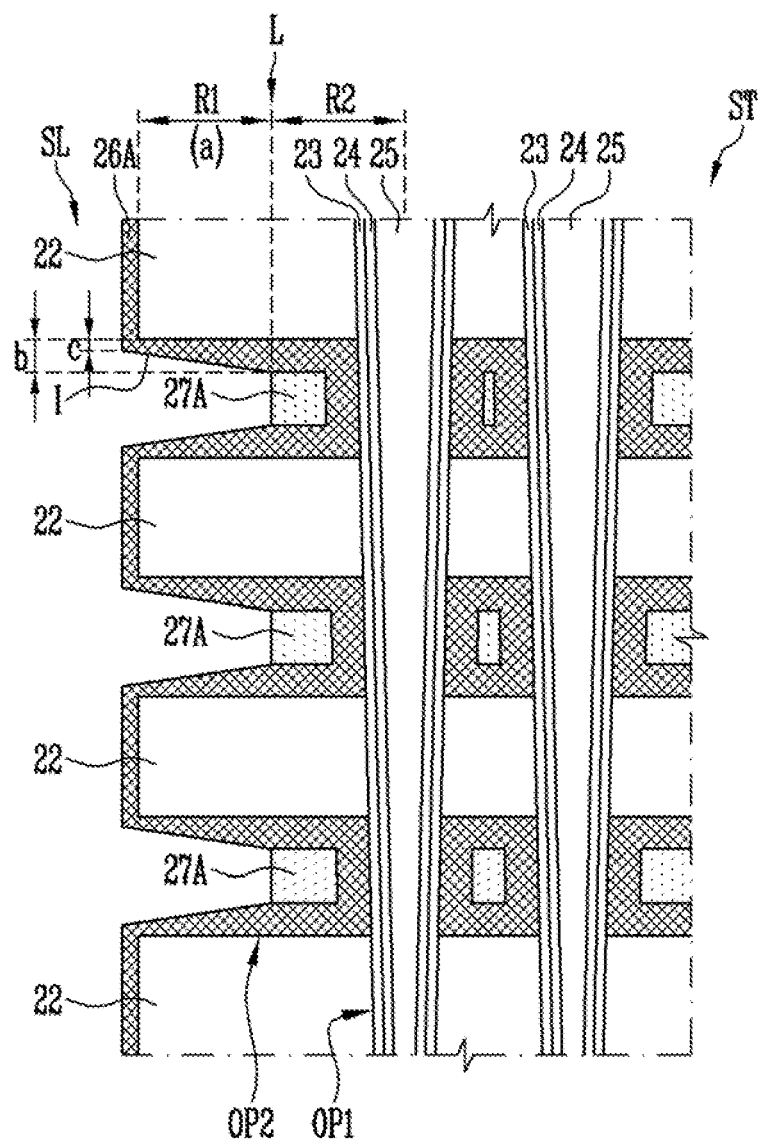

SEMICONDUCTOR DEVICE INCLUDING BARRIER PATTERN AND METAL PATTERN

CROSS-REFERENCE TO RELATED APPLICATION

This application is a continuation of U.S. patent application Ser. No. 15/255,269 filed on Sep. 2, 2016, which claims priority under 35 U.S.C. § 119(a) to Korean patent application number 10-2016-0037710 filed on Mar. 29, 2016. The disclosure of each of the foregoing application is incorporated herein by reference in its entirety.

BACKGROUND

1. Field

An aspect of the present disclosure relates generally to an electronic device and, more particularly, to a three-dimensional semiconductor device and a manufacturing method thereof.

2. Description of the Related Art

Nonvolatile memory devices are memory devices which retain stored data even when a power supply is turned off. Recently, as improvements of the degree of integration of two-dimensional nonvolatile memory devices in which memory cells are formed in a single layer over a silicon substrate have reached a limit, there has been proposed a three-dimensional nonvolatile memory device in which memory cells are three-dimensionally arranged. A three-dimensional (3-D) nonvolatile memory device includes vertical channel layers protruding from a substrate, and a plurality of memory cells are stacked along each vertical channel layer.

SUMMARY

Embodiments provide a semiconductor device which is easily manufactured and has improved loading characteristics, and a manufacturing method thereof.

According to an aspect of the present disclosure, there is provided a method for manufacturing a semiconductor device, the method including: alternately forming first sacrificial layers and insulating layers; forming channel patterns penetrating the first sacrificial layers and the insulating layers; forming a slit penetrating the first sacrificial layers and the insulating layers; forming openings by removing the first sacrificial layers through the slit; and respectively forming, in openings, conductive layers including first barrier patterns having inclined inner surfaces and metal patterns in the first barrier patterns.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which:

FIG. 1A is a layout illustrating a structure of a semiconductor device, according to an embodiment of the present invention;

FIGS. 2A to 2E are cross-sectional views illustrating a manufacturing method for a semiconductor device, according to an embodiment of the present invention;

DETAILED DESCRIPTION

Figure 1B:
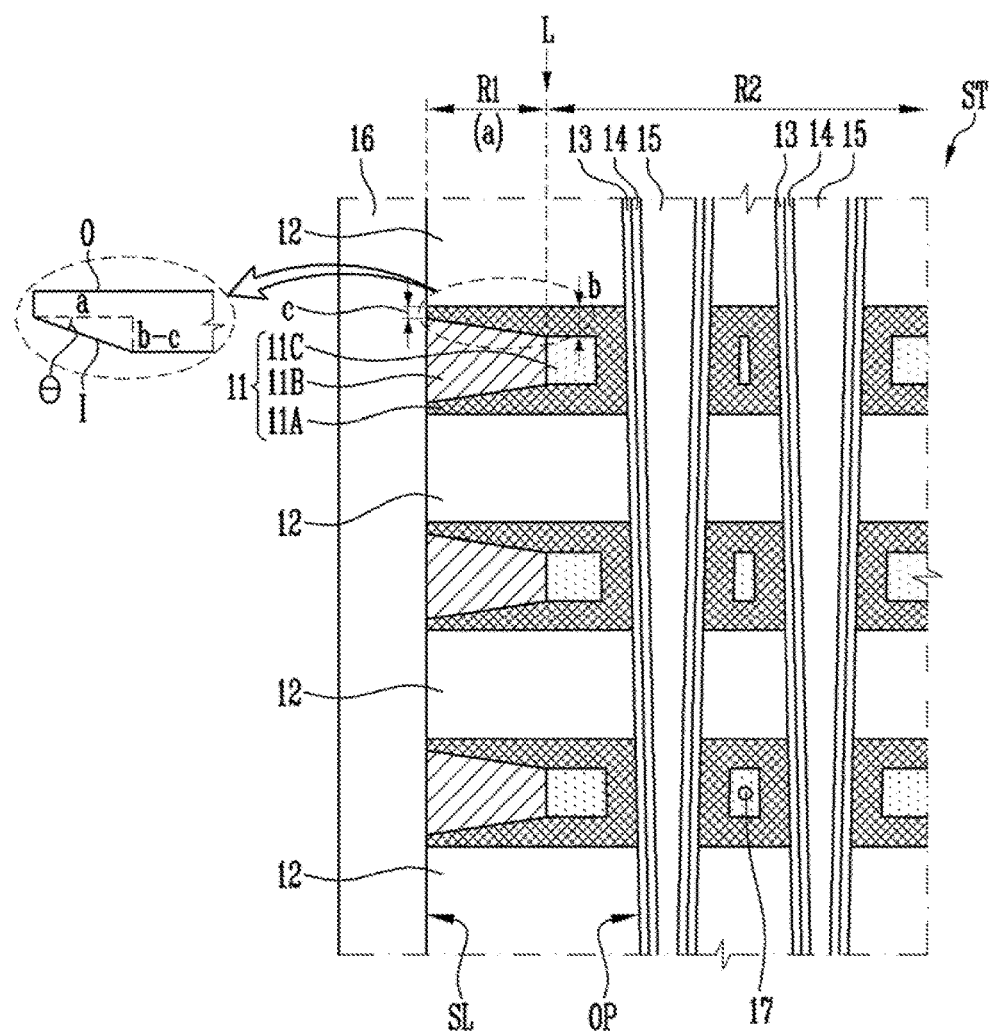
FIGS. 1B to 1F are cross-sectional views illustrating structures of semiconductor devices, according to an embodiment of the present invention.

Example embodiments of the present disclosure will be described with reference to the accompanying drawings. The example embodiments of the present disclosure may, however, be embodied in many other different forms and should not be construed as being limited only to the embodiments set forth herein. Rather, the described embodiments are provided so that disclosure of the present disclosure will be thorough and complete, and will fully convey the scope of the present disclosure to those skilled in the art.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated to more clearly illustrate the various elements of the embodiments. For example, for convenience of illustration in the drawings, the size of elements and the intervals between elements may be exaggerated compared to actual sizes and intervals.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described in detail with reference to the attached drawings.

Like reference numerals refer to like elements throughout.

FIG. 1A is a layout illustrating a structure of a semiconductor device, according to an embodiment of the present invention.

FIG. 1B is a side cross-sectional view illustrating a structure of a semiconductor device, according to the embodiment of the present invention.

Referring to FIGS. 1A and 1B, the semiconductor device includes a stack structure ST, channel patterns 14 penetrating the stack structure ST, and a slit SL penetrating the stack structure ST.

The stack structure ST includes conductive layers 11 and insulating layers 12, which are alternately stacked. The conductive layers 11 may be, for example, gate electrodes of stacked select transistors, and memory cells. The conductive layers 11 may be made of or include, for example, at least one of tungsten (W), tungsten nitride ($WN_x$), titanium (Ti), titanium nitride (TiN), tantalum (Ta), tantalum nitride (TaN), polysilicon, silicide, and the like. The insulating layers 12 are used to insulate the stacked gate electrodes from each other, and may be made of or include, for example, oxide and the like.

Each of the conductive layers 11 may include a barrier pattern 11A having an inclined inner surface, a metal pattern 11B and a sacrificial pattern 11C, which are formed inside the barrier pattern 11A. The barrier patterns 11A are respectively interposed between the stacked insulating layers 12, and each of the barrier patterns 11A may be formed on a lower surface of an upper insulating layer 12, an upper surface of a lower insulating layer 12, and a sidewall of a memory pattern 13.

The barrier pattern 11A has an inclined inner surface I. In addition, the inner surface I of the barrier pattern 11A is not parallel to an outer surface O of the barrier pattern 11A, and may be tilted at a predetermined angle θ with respect to the outer surface O of the barrier pattern 11A. For example, as illustrated in FIG. 1B, the barrier pattern 11A may include an inclined inner surface I relative to a horizontal substrate surface and an outer surface O that lies flat with respect to substrate surface. For reference, "inclined" and "flat" refer to the orientation of the inner and outer surfaces of the barrier pattern, respectively, in relation to the orientation of the substrate surface (not shown), or a top surface of the stack structure ST, or the upper or lower surface of any of the insulating layers 12.

If both the inner surface I and the outer surface O of the barrier pattern 11A are parallel and have an inclination, the thickness of the conductive layer 11 would increase as the volume of the metal pattern 11B increases. In this case, the height of the stack structure ST would also increase, and, hence, introduce a limitation in improving the degree of integration of the memory device. On the other hand, according to the embodiment of the present invention, only the inner surface I of the barrier pattern 11A has an inclination while the outer surface O of the barrier pattern 11A is flat. For example, the outer surface O of the barrier pattern 11A has a horizontal orientation lying flat against an adjacent surface of the insulating layer 12. Thus, it is possible to increase the volume of the metal pattern 11B while maintaining the thickness of the conductive layer 11.

The barrier pattern 11A may have the inclined inner surface I in only a partial region. The barrier pattern 11A may include a first region R1 having the inclined inner surface I and a second region R2 having a non-inclined inner surface. In this case, the second region R2 of the barrier pattern 11A has a uniform thickness, and the first region R1 of the barrier pattern 11A may have a thickness that gradually decreases as it comes closer to the slit SL. For example, the minimum thickness of the barrier pattern 11A, that is, the thickness of the barrier pattern at the point at which it reaches the slit may be from about 5 to about 30 Å.

In FIG. 1B, the boundary between the first and second regions R1 and R2 is noted with a broken boundary line L. Hence, a place at which the metal pattern 11B and the sacrificial pattern 11C contact each other may be the boundary line L. Based on the boundary line L, the first region R1 is adjacent to the slit SL whereas the second region R2 is relatively spaced apart from the slit SL. In addition, the metal pattern 11B is formed in the first region R1, to be relatively adjacent to the slit SL, and the sacrificial pattern 11C is formed in the second region R2, to be relatively spaced apart from the slit SL.

In FIG. 1B, it is illustrated that the boundary line L is located between the channel pattern 14 located closest to the slit SL and the slit SL. The boundary line L may be located midway between the channel pattern 14 and the slit SL, or closer to the slit SL or the channel pattern 14. Meanwhile, the boundary line L may overlap with the channel pattern 14, or may be located between the channel patterns 14.

The position of the boundary line L and the thickness of the barrier pattern 11A determine the volume of the metal pattern included in the conductive layer 11, and accordingly, the resistance value of the conductive layer 11. Therefore, the position of the boundary line L is determined by considering the resistance value of the conductive layer 11 and loading characteristics. For example, the thickness of the barrier pattern 11A and the position of the boundary line L may satisfy the following Equation 1.

$$\tan\theta = \frac{b-c}{a} \leq \frac{1}{5} \qquad \text{Equation 1}$$

In equation 1, a is a distance from the slit SL to the boundary line L, b is a thickness of the second region R2 of the barrier pattern 11A, and c is a minimum thickness of the barrier pattern 11A in the first region R1.

The metal pattern 11B may be located in the first region R1 of the barrier pattern 11A, and the sacrificial pattern 11C may be located in the second region R2 of the barrier pattern 11A. The metal pattern 11B may have a tapered shape, in which its thickness increases as it comes closer to the slit SL. The sacrificial pattern 11C may extend to the inside of the stack structure ST to fill in spaces between adjacent channel patterns 14. Also, the sacrificial pattern 11C may include voids 17 located between adjacent channel patterns 14.

The barrier pattern 11A is used to increase adhesion between layers, for example, adhesion between the insulating layer and the metal pattern 11B. The barrier pattern 11A may be made of or include, for example, at least one of titanium nitride (TiN), tantalum (Ta), tantalum nitride (TaN), and the like. The metal pattern 11B may be made of or include a material having a lower resistance than the barrier pattern 11A. The metal pattern 11B may be made of or include, for example, at least one of tungsten (W), tungsten nitride ($WN_x$), silicide, and the like. The sacrificial pattern 11C may include a dielectric material, such as, for example, at least one of oxide, nitride, silicon (Si), and the like.

Referring to FIG. 1A, the channel patterns 14 are arranged in a first direction I-I' and a second direction II-II' intersecting the first direction I-I'. For example, the channel patterns 14 may be arranged so that the centers of channel patterns 14 adjacent in the first direction I-I' are offset and the centers of channel patterns 14 adjacent in the first direction II-II' correspond to each other. The channel layers 14 are configured so that they are spaced apart in the II-II' direction at a first regular interval and are spaced apart in a diagonal direction at a second regular interval between the II-II' and I-I' directions. As illustrated in FIG. 1A the first and second regular intervals may be the same, however, the invention is not limited in this way. The channel patterns 14 also extend in a direction perpendicular to the plane defined by the II-II' and I-I' directions and penetrate the stack structure ST. The channel patterns 14 may be formed in respective openings OP penetrating the stack structure ST. The openings OP may have a cross-section that is circular as illustrated in FIG. 1A. However, the invention is not limited in this way. For example, the openings OP may have a cross-section that is elliptical, quadrangular such as square, polygonal section such as hexagonal, and the like. The openings OP may have a tapered cross-section with a largest cross-sectional area at an uppermost surface and the smallest cross-sectional area at a lowermost surface, as illustrated in FIG. 1B. In another embodiment, (not shown) the openings OP may have a constant cross-section along their entire length. The channel patterns 14 may have a shape that conforms to the openings OP.

The channel patterns 14 may be, for example, channel layers of the stacked select transistors, memory cells, and the like. The channel patterns 14 may be made or include, for example, at least one semiconductor material, such as silicon (Si) and germanium (Ge). The memory patterns 13 may be formed on sidewalls of the respective channel patterns 14. The memory patterns 13 may be gate insulating layers of the select transistors, or may be data repositories of the memory cells. For example, each of the memory patterns 13 may include at least one of a tunnel insulating layer, a data storage layer, and a charge blocking layer. These layers are well-known in the art and are thus not shown here to avoid obscuring the illustration with well-known details. For example, the data storage layer may include a floating gate made of or including polysilicon, a charge trap layer made of or including nitride, a phase changeable material, nanodots, and the like. The channel patterns 14 may have a shape in which its central region is open. An insulating pattern 15 may be filled in the open central region. In the illustrated embodiment of FIG. 1B, the insulating pattern 15, the channel pattern 14, and the memory pattern 13, which are formed in one opening OP, have concentric cylindrical shapes.

When viewed from the top (See FIG. 1A) The slit SL may have an elongated, line shape extending in the second direction II-II'. When viewed from the side (see FIG. 1B) the slit SL may extend perpendicularly to the plane defined by the I-I' and II-II' directions to penetrate the stack structure ST. The slit SL may be filled with a slit insulating layer 16. The slit insulating layer 16 may include a void (not shown).

According to the structure described above, the volume of the metal pattern 11B included in one conductive layer 11 may be increased, so that it is possible to decrease resistance, while not increasing the thickness of the conductive layer 11. Thus, it is possible to improve the loading characteristics of the semiconductor device.

FIGS. 1C to 1F are sectional views illustrating various structures of semiconductor devices, according to embodiments of the present invention. Hereinafter, contents overlapping with those described above will be omitted.

Figure 1C:
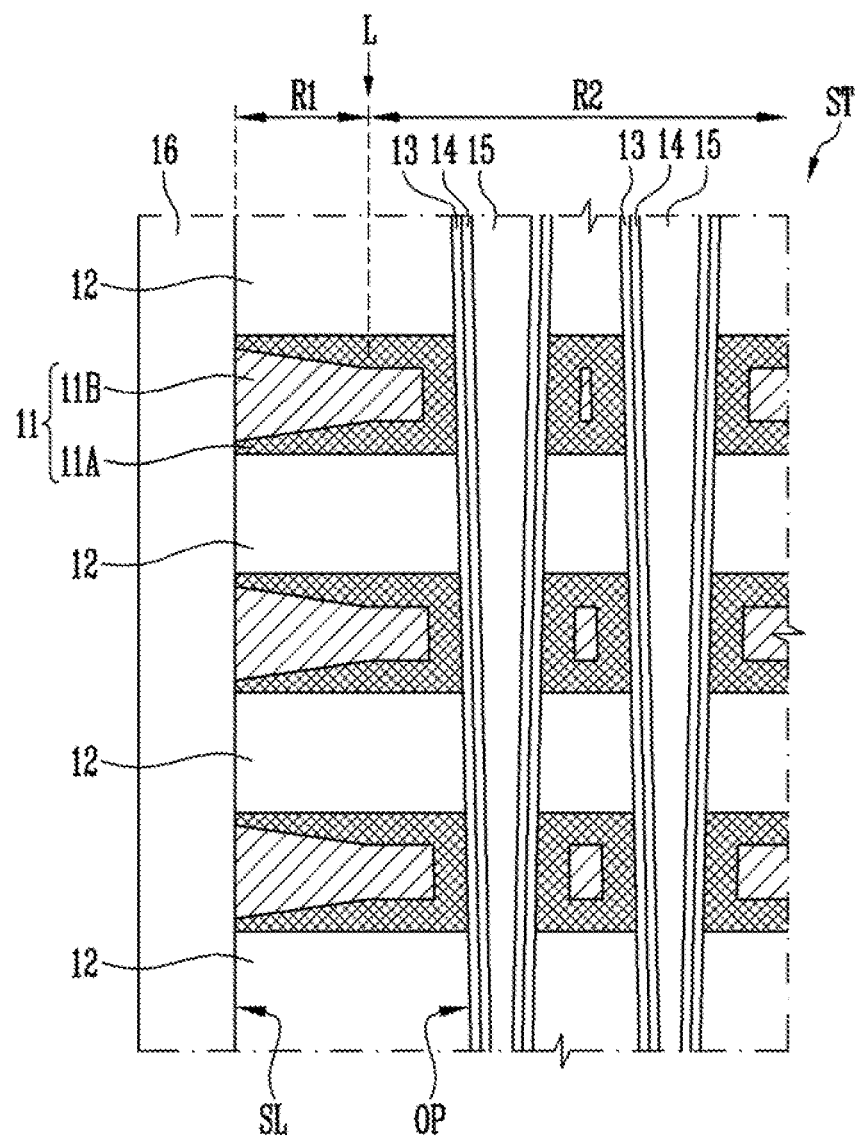

Referring to FIG. 1C, each of the conductive layers 11 may include a barrier pattern 11A and a metal pattern 11B in the barrier pattern 11A. Unlike the embodiment of FIGS. 1A and 1B, in the embodiment of FIG. 1C there is only a metal pattern 11B and no sacrificial pattern 11C. More specifically, in the embodiment of FIG. 1C, instead of a sacrificial pattern 11C in the second region R2, the metal pattern extends inside the second region R2. Hence, the metal pattern 11B has a uniform thickness in the second region R2. The metal pattern 11B has a non-uniform thickness in the first region R1 with the thickness of the metal pattern 11B increasing as it comes closer to the slit SL in the first region R1. Also, the metal pattern 11B may be filled in spaces between adjacent channel patterns 14.

Figure 1D:
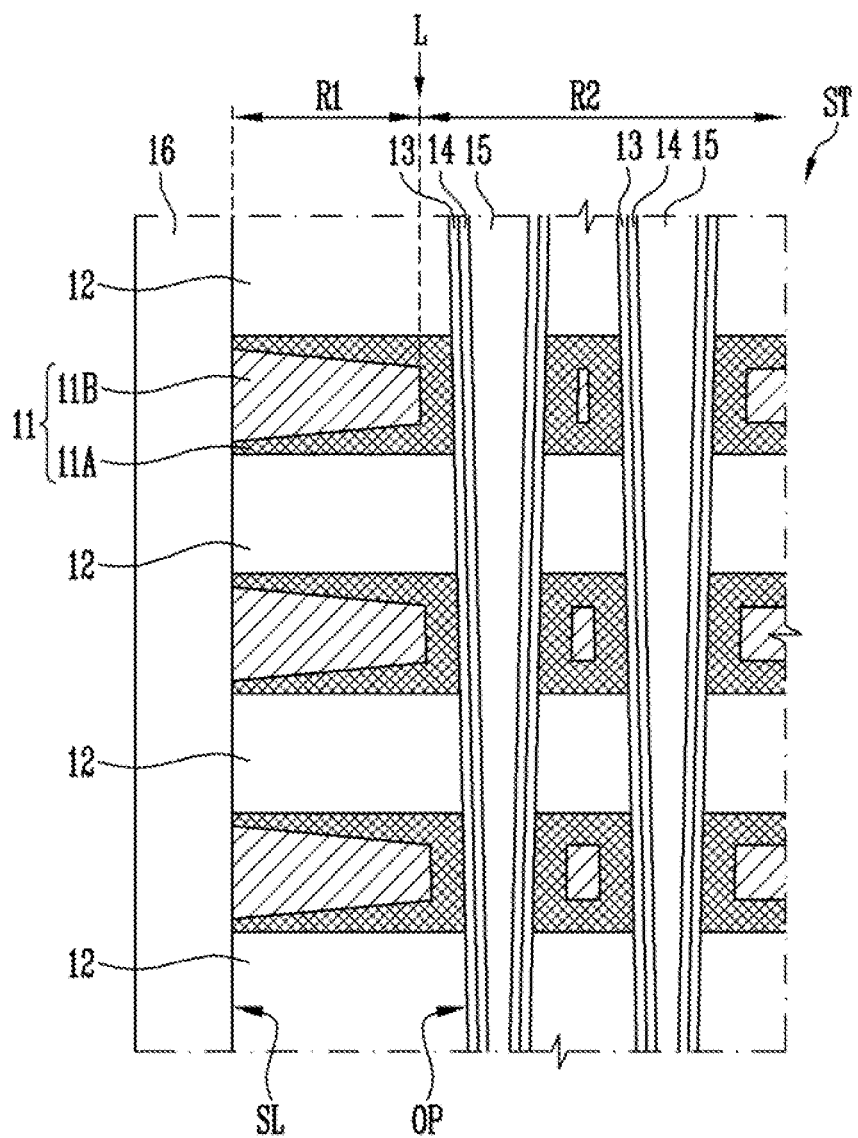

Referring to FIG. 1D, each of the conductive layers 11 may include a barrier pattern 11A and a metal pattern 11B in the barrier pattern 11A. As compared with the embodiment described with reference to FIG. 1C, in this embodiment, the boundary line L is located further adjacent to the channel pattern 14. Thus, each of the barrier patterns 11A has a shape in which its thickness increases as it comes closer to the channel pattern 14 from the slit SL. In addition, each of the metal patterns 11B has a shape, for example, a tapered shape, in which its thickness decreases as it comes close to the channel pattern 14 from the slit SL. For reference, a case in which the metal pattern 11B is filled between adjacent channel patterns 14 is illustrated in this figure, but a sacrificial pattern may be filled as described with reference to FIG. 1B.

Figure 1E:
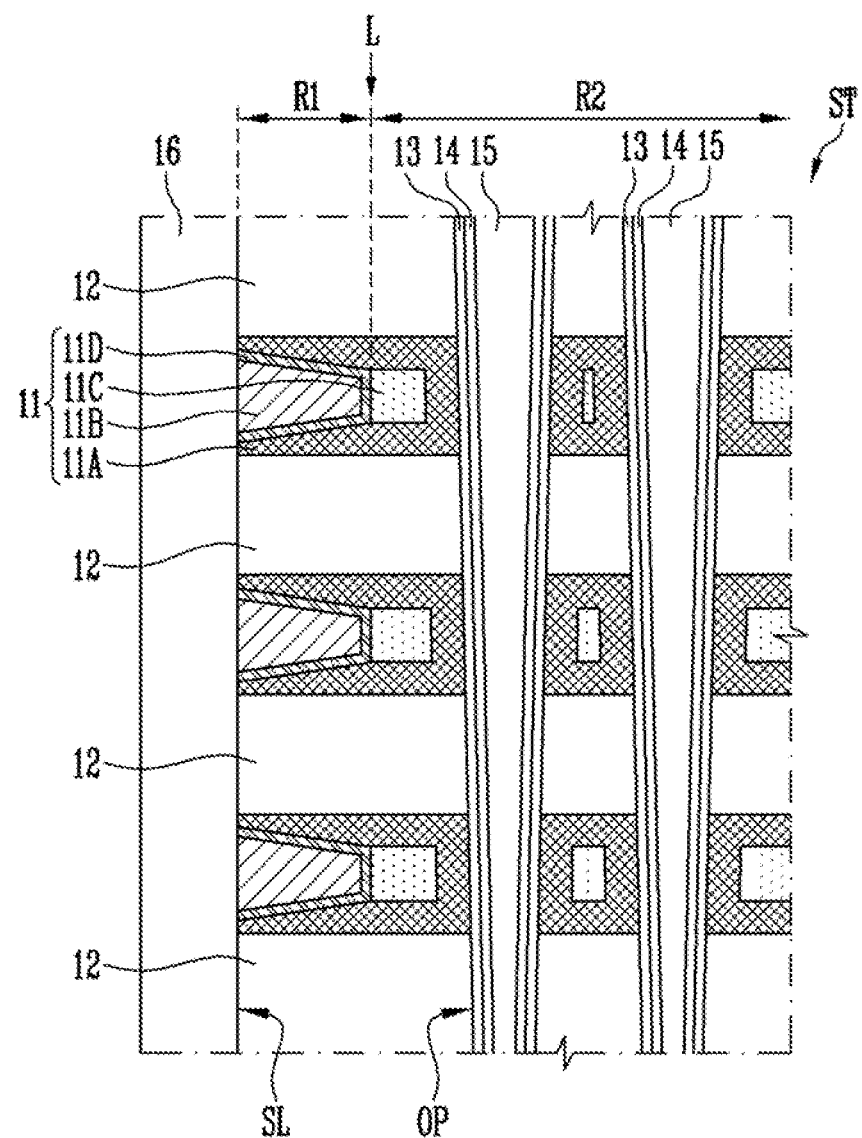

Referring to FIG. 1E, each of the conductive layers 11 may include a first barrier pattern having an inclined inner surface, a metal pattern 11B, a sacrificial pattern 11C, and a second barrier patter 11D. The second barrier pattern 11D, as illustrated in the embodiment of FIG. 1E, is formed to surround the metal pattern 11B. A first part of the second barrier pattern 11D is interposed between the interface of the inclined surface of the metal pattern 11B and the first barrier pattern 11A. A second part of the second barrier pattern 11D is interposed between the vertical that is, perpendicular to the plane of II-II' and I-I', interface of the metal pattern 11B and the sacrificial pattern 11C. For example, the second barrier pattern 11D may be formed to contact the inclined inner surface of the first barrier pattern 11A and the sacrificial pattern 11C. The second barrier pattern 11D may have a thinner thickness than the first barrier pattern 11A. In a variation of the embodiment of FIG. 1E, each of the conductive layers 11 may be formed without a sacrificial pattern 11C. In such a variant of the embodiment of FIG. 1E, the vertical surface of the second barrier layer may lie adjacent the memory layer 13.

Figure 1F:
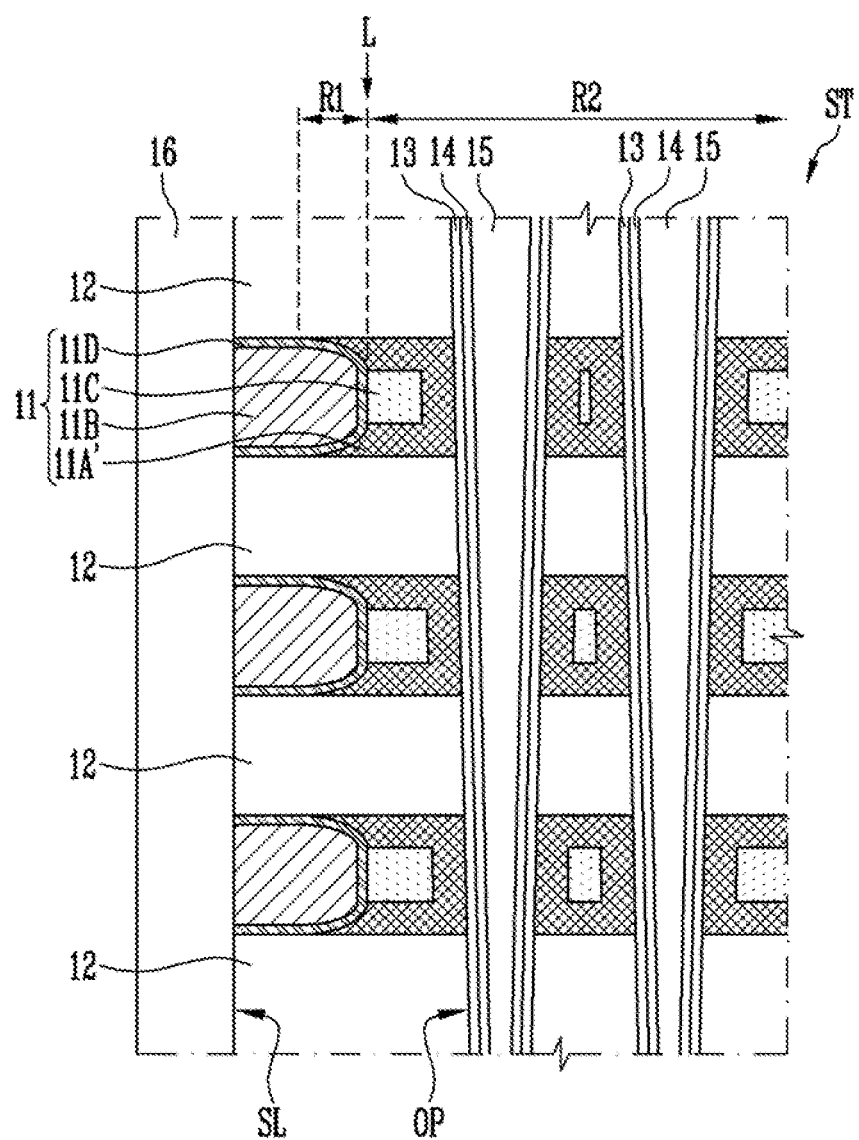

Referring to FIG. 1F, each of the conductive layers 11 may include a first barrier pattern 11A' having an inclined inner surface, a metal pattern 11B, a sacrificial pattern 11C, and a second barrier pattern 11D. Here, unlike the embodiment of FIG. 1E, the inclined inner surface of the first barrier pattern 11A' may be a curved surface. For example, as illustrated in FIG. 1F, the curved surface of the first barrier pattern 11A' may be a parabolic curved surface having a curvature which decreases as it extends towards the slit SL.

The first barrier pattern 11A' in the first region R1 may be spaced apart from the slit SL. In this case, the first barrier pattern 11A' does not exist in a region adjacent to the slit SL, and the second barrier pattern 11D and the insulating layers 12 directly contact each other.

FIGS. 2A to 2E are side cross-sectional views illustrating a manufacturing method for a semiconductor device, according to an embodiment of the present invention.

Figure 2A:
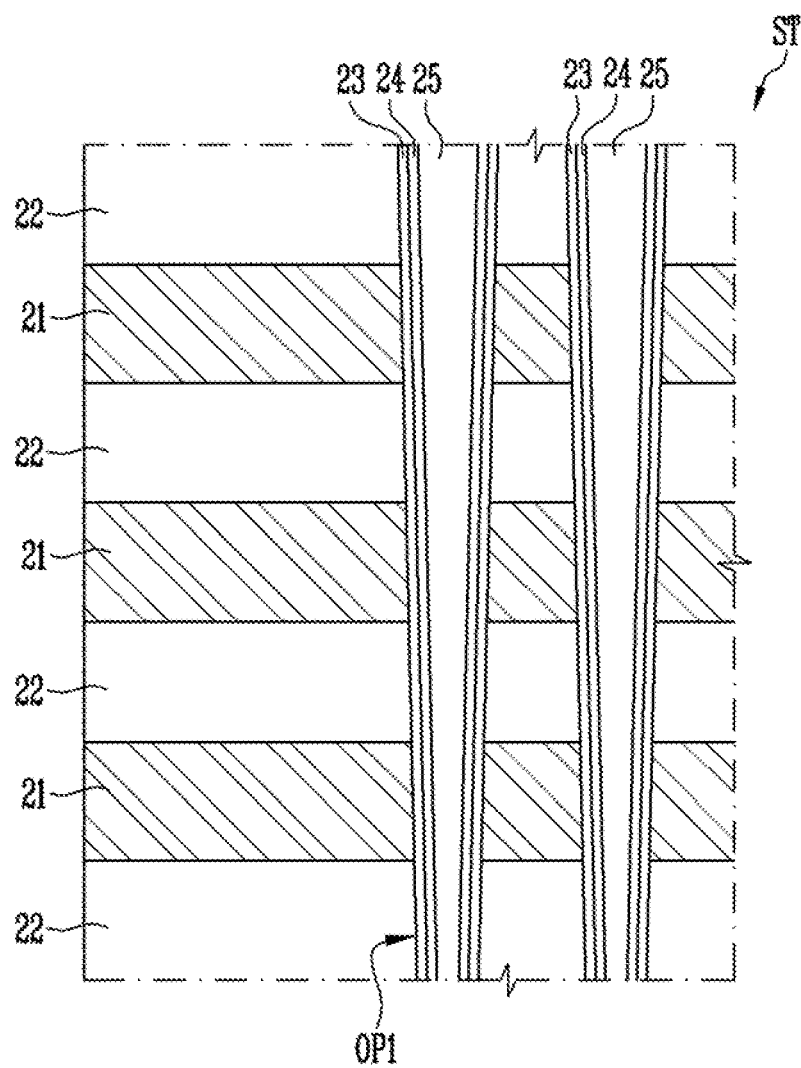

Referring to FIG. 2A, first sacrificial layers 21 and insulating layers 22 are alternately stacked, thereby forming a stack structure ST. Here, the first sacrificial layers 21 form gate electrodes, for example, of stacked memory cells, select transistors, and the like, and the insulating layers 22 insulate the stacked gate electrodes from each other. The first sacrificial layers 21 are formed of a material having a high etching selection ratio with respect to the insulating layers 22. For example, the first sacrificial layers 22 may be made of or include nitride and the insulating layers 22 may be made of or include oxide.

Subsequently, first openings OP1 penetrating the stack structure ST are formed. The first openings OP1 may have a circular section, an elliptical section, a quadrangular section, a polygonal section, or the like. Each of the first openings OP1 may have a uniform size cross-section from its uppermost end to its lowermost end. Each of the first openings OP1 may have a variable size, cross-section along its entire length. For example, as illustrated in FIG. 2A, each of the first openings OP1 may be tapered having the largest cross-section at its uppermost end and the smallest cross-section at its lowermost end.

Subsequently, a memory pattern 23 and a channel pattern 24 are sequentially formed in each of the first openings OP1. The channel pattern 24 may be formed to have a thickness which completely fills each of the first openings OP1, or may be formed to have a thickness in which its central region is open. When the central region of the channel pattern 24 is open, an insulating pattern 25 may be formed in the open central region, as illustrated in FIG. 2A.

Figure 2B:
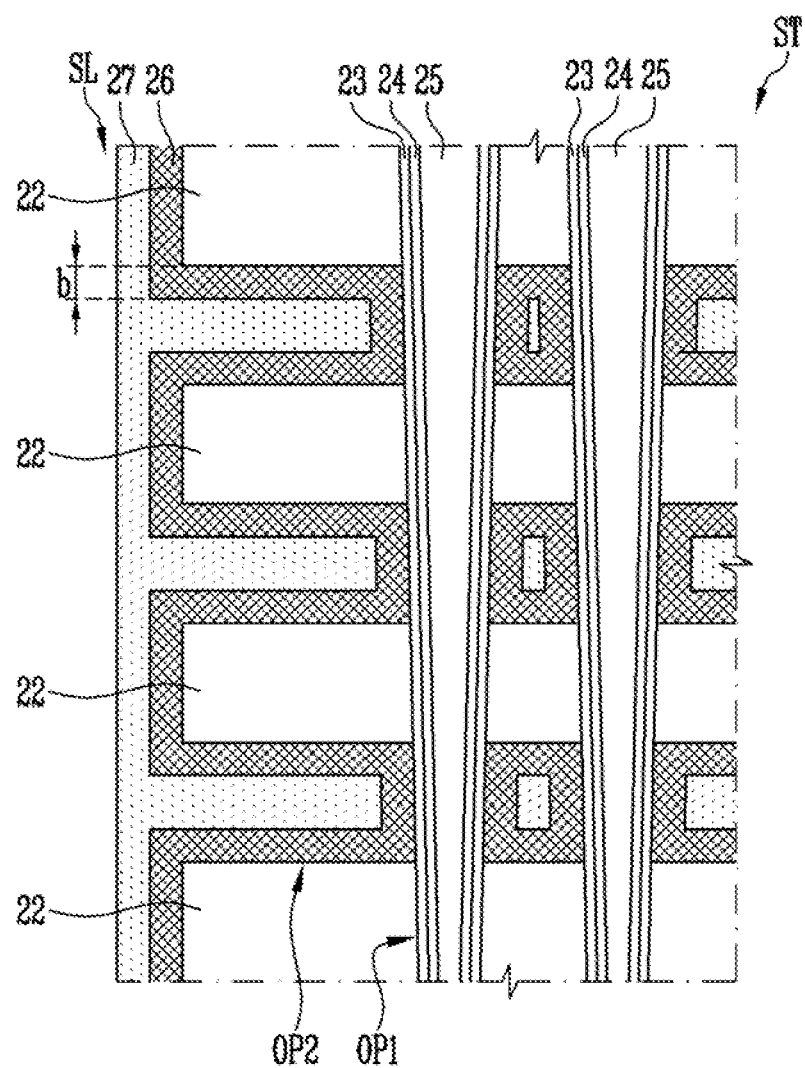

Referring to FIG. 2B, a slit SL penetrating the stack structure ST is formed, and the first sacrificial layers 21 are then removed through the slit SL, thereby forming second openings OP2. Subsequently, a barrier layer 26 is formed in the second openings OP2 through the slit SL. For example, the barrier layer 26 may be made of or include titanium (Ti), titanium nitride (TiN), tantalum (Ta), tantalum nitride (TaN), and the like.

The barrier layer 26 may be formed to conform along the inner surfaces of the slit SL and the second openings OP2. The barrier layer 26 may also be formed on the memory patterns 23 exposed in the second openings OP2. The barrier layer 26 may be formed to have a uniform thickness b where it is not completely filled in the second openings OP2.

Subsequently, a second sacrificial layer 27 is formed in the second openings OP2 through the slit SL. The second sacrificial layer 27 may be formed to conform to the barrier layer 26 and fill in the second openings OP2. The second sacrificial layer 27 may also be formed in the slit SL. The second sacrificial layer 27 may be formed of a material having a high etching selection ratio with respect to the barrier layer 26. For example, the second sacrificial layer 27 may be made of or include a dielectric material, such as oxide or nitride, silicon (Si), or combinations thereof.

Referring to FIG. 2C, the second sacrificial layer 27 is partially removed, thereby forming second sacrificial patterns 27A and partially exposing the barrier layer 26. For example, the second sacrificial layer 27 is partially etched using a dry etching process to expose a region adjacent to the slit SL in the barrier layer 26. At this time, the second sacrificial layer 27 is removed towards the channel pattern 24 from the slit SL, and the position of a boundary line L is determined according to an amount of the removed second sacrificial layer 27. Here, the exposed region of the barrier layer 26 becomes a first region R1, and a portion at which the second sacrificial patter 27A remains, that is, an unexposed region of the barrier layer 26 becomes a second region R2. The second sacrificial patter 27A may fill in spaces between adjacent channel patterns 24.

An inclined inner surface of the barrier layer 26 may be formed in the process of partially etching the second sacrificial layer 27. As described above, the second sacrificial layer 27 is etched from a region close to the slit SL, and hence the barrier layer 26 is also exposed from the region close to the slit SL. In addition, as a region of the barrier layer 26 comes close to the slit SL, the region is exposed for a long period of time in the etching process, thereby increasing the amount in which the barrier layer 26 is etched. Thus, the region of the barrier layer 26 that is closer to the slit SL has a thinner thickness than a region of the barrier layer 26 that is further away from the slit. Accordingly, there is formed a barrier layer 26A having the inclined inner surface I.

When the second sacrificial layer 27 is etched, the degree of etching of the barrier layer 26 and the gradient of the inner surface may be adjusted by adjusting the etching selection ratio between the barrier layer 26 and the second sacrificial layer 27. The second sacrificial layer 27 is etched under a condition in which the etch rate of the second sacrificial layer 27 is higher than that of the barrier layer 26. The etch selectivity ratio of the barrier layer 26 and the second sacrificial layer 27 may vary and may be, for example, from about 1:5 to about 1:50 or from about 1:5 to about 1:20. For example, based on a section of the second opening OP2, an amount a in which the second sacrificial layer 27 is etched in the second opening OP2 and an amount b-c in which the barrier layer 26 is etched in the second opening OP2, may satisfy the relationship $1:5 \leq b\text{-}c\text{:}a \leq 1:50$.

Figure 2D:
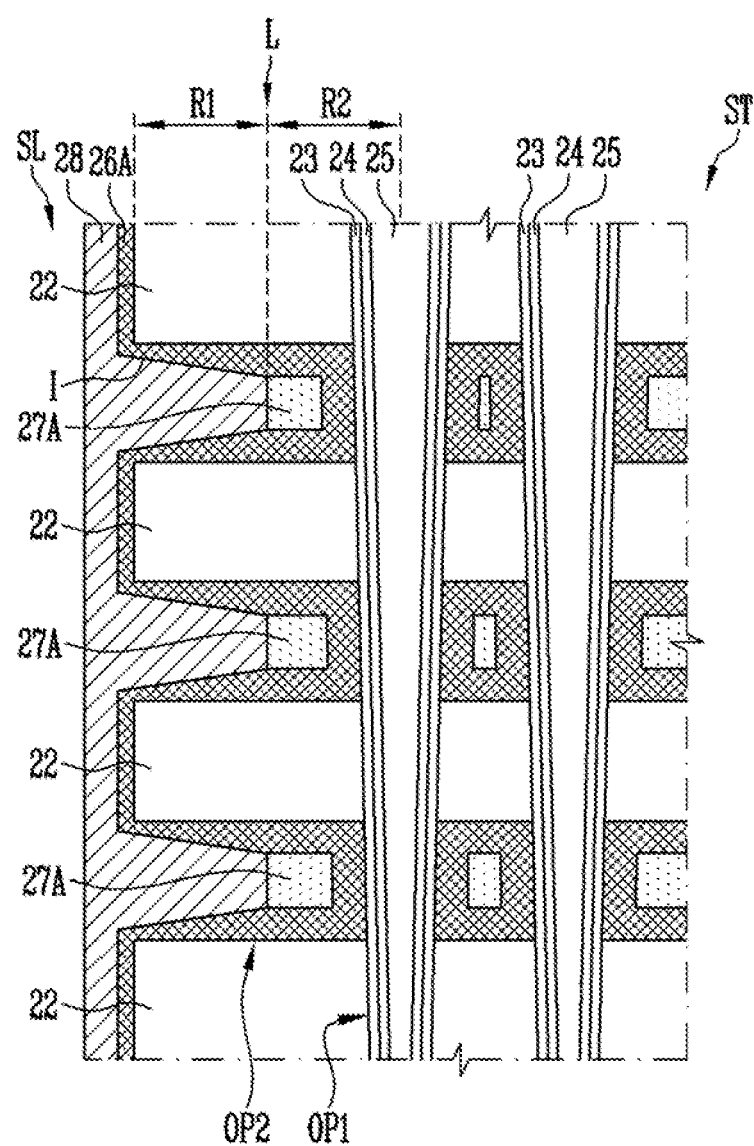

Referring to FIG. 2D, a metal layer 28 is formed in the first region R1 of the barrier layer 26A. For example, the metal layer 28 may be formed to fill in the second opening OP2. The metal layer 28 may also be formed in the slit SL. At this time, the first region R1 of the barrier layer 26A has the inclined inner surface I, and thus it is possible to prevent the entrance of the second opening OP2 from being closed before the metal layer 28 is completely filled in the second opening OP2. Accordingly, it is possible to prevent a void from being formed in the first region R1 of the metal layer 28. The metal layer 28 may include a metal having a lower resistance than the barrier layer 26A. For example, the metal layer 28 may include tungsten (W), tungsten nitride ($WN_x$), silicide, and the like.

Figure 2E:
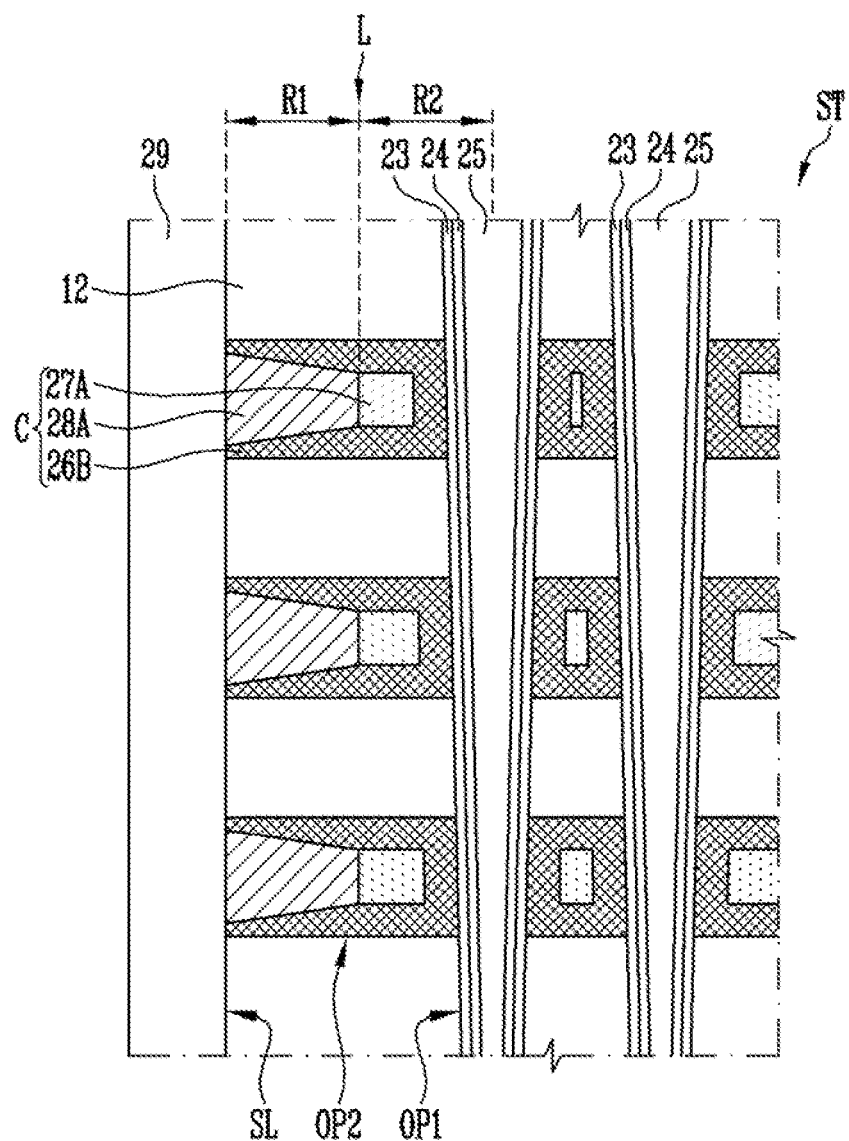

Referring to FIG. 2E, the barrier layer 26A and the metal layer 28, which are formed in the slit SL, are removed, thereby forming barrier patterns 26B and metal patterns 28A, which are respectively located in the second openings OP2. Accordingly, there are formed conductive layers C including the barrier patterns 26B, the metal patterns 28A, and the second sacrificial patterns 27A. Subsequently, a slit insulating layer 29 is formed in the slit SL.

Here, each of the barrier patterns 26B has an inclined inner surface. For example, the barrier pattern 26B has a uniform thickness in a region contacted with the second sacrificial pattern 27A, and may have an inclined inner surface in a region contacted with the metal pattern 28A. In addition, the barrier pattern 26B may have a shape in which its thickness gradually decreases as it approaches the slit insulating layer 29. The metal pattern 28A contacts the second sacrificial pattern 27A, and may have a tapered shape which has a thickness which gradually increases as it comes closer to the slit insulating layer 29.

According to the manufacturing method described above, a process of forming the second sacrificial patterns 27A is used, so that it is possible to easily form the inclined inner surface I while maintaining the outer surface of the barrier layer 26A to be substantially horizontal, that is, flat. Further, it is possible to form the conductive layers C including no void.

The embodiments shown in FIGS. 1C to 1E may also be formed using the manufacturing method described above. As an example, the second sacrificial patterns 27A may be removed before the metal layer 28 is formed. In this case, the structure of FIG. 1C may be formed in which the metal patterns 28A are filled between the channel patterns 24. As another example, when the second sacrificial pattern 27A is formed, the amount in which the second sacrificial layer 27 is etched is increased, so that the boundary line L is further spaced apart from the slit SL. In this case, the area of the first region R1 of the barrier pattern 26B is increased, and the structure of FIG. 1D may be formed. As still another example, a second barrier layer is formed before the metal layer 28. In this case, a second barrier pattern is formed between the barrier pattern 26B and the metal pattern 28A and between the metal pattern 28A and the second sacrificial pattern 27A, and the structure of FIG. 1E may be formed.

Figure 3A:
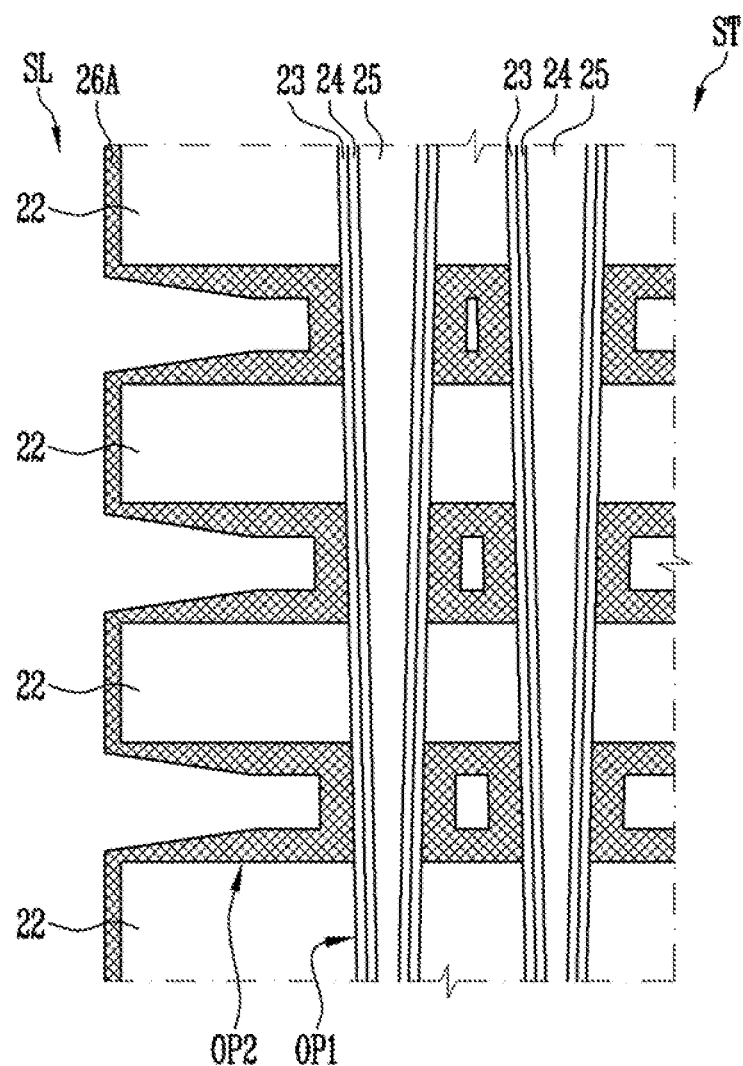
FIGS. 3A to 3C are cross-sectional views illustrating a manufacturing method for a semiconductor device according to an embodiment of the present invention.
Figure 3B:
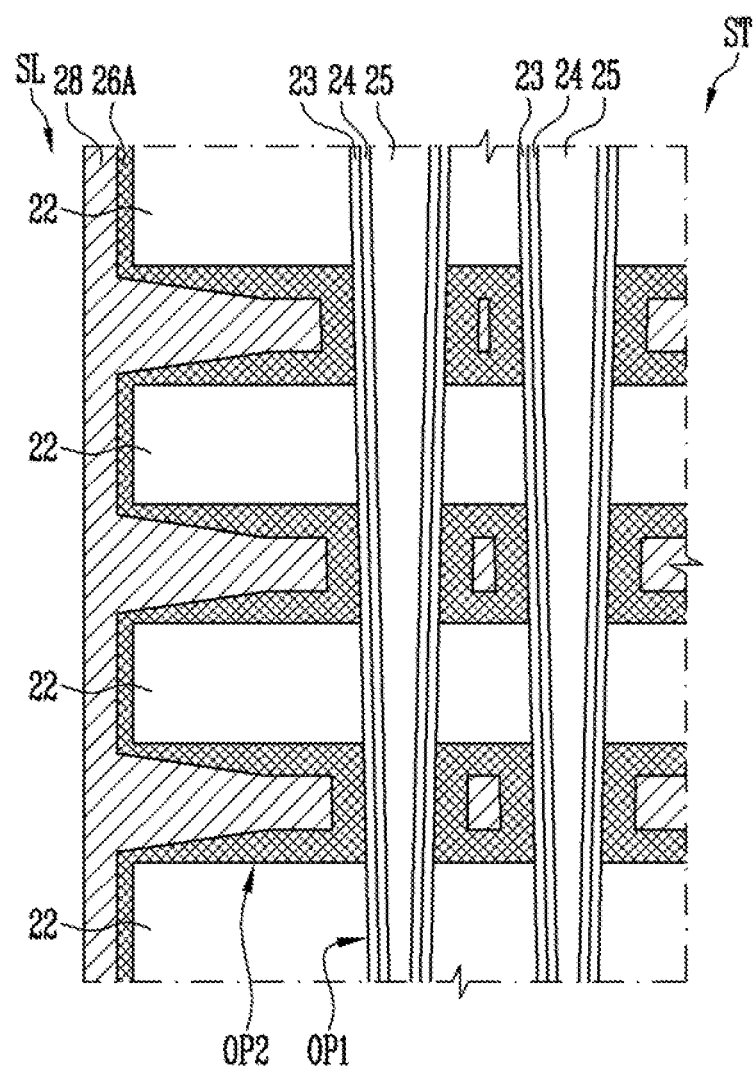
Figure 3C:
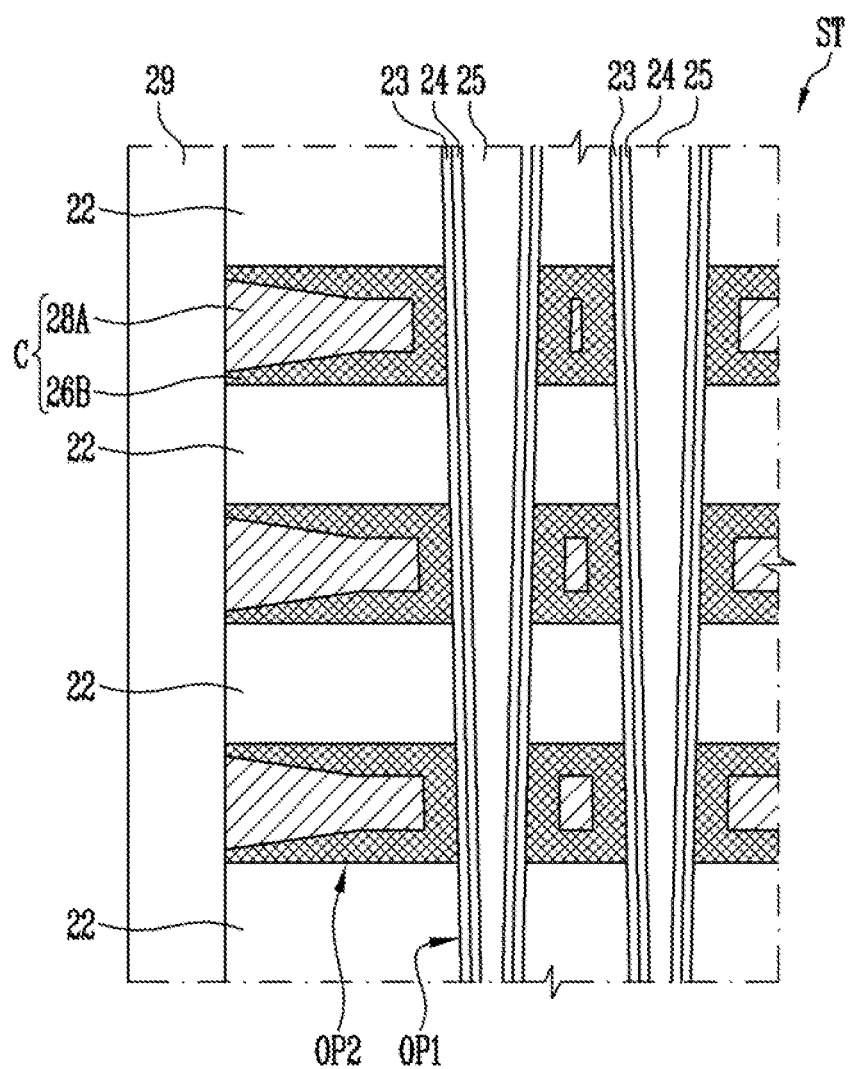

FIGS. 3A to 3C are sectional views illustrating a manufacturing method for a semiconductor device according to an embodiment of the present invention. Hereinafter, contents overlapping with those described above will be omitted.

First, as described with reference to FIGS. 2A to 2C, a barrier layer 26A having an inclined inner surface and second sacrificial patterns 27A are formed by partially removing a second sacrificial layer 27. Subsequently, referring to FIG. 3A, the second sacrificial patterns 27A are selectively removed through a slit SL. Accordingly, the sacrificial pattern 27A formed not only in a region between the slit SL and a channel pattern 24 but also regions between adjacent channel patterns 24 are removed.

Referring to FIG. 3B, a metal layer 28 is formed in the barrier layer 26A through the slit SL. Thus, the metal layer 28 fills the second openings OP2 and partially fills the slit SL. For example, the metal layer 28 is formed in the region between the slit SL and the channel pattern 24 and the regions between the adjacent channel patterns 24.

Referring to FIG. 3C, the metal layer 28 and the barrier layer 26A, which are formed in the slit SL, are removed, thereby forming metal patterns 28A and barrier patterns 26B. Accordingly, there are formed conductive layers C each including the barrier pattern 26A having an inclined inner surface and the metal pattern 28A.

FIGS. 4A to 4D are sectional views illustrating a manufacturing method for a semiconductor device, according to an embodiment of the present invention. Hereinafter, contents overlapping with those described above will be omitted.

Figure 4A:
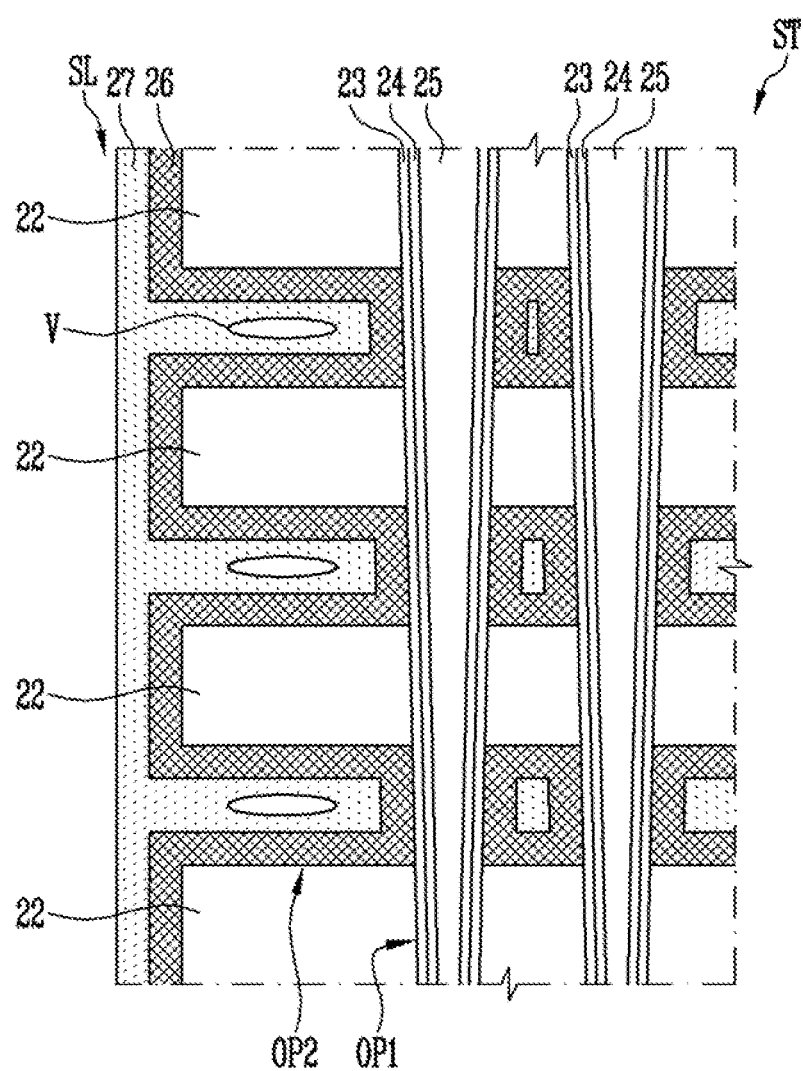
FIGS. 4A to 4D are cross-sectional views illustrating a manufacturing method for a semiconductor device, according to an embodiment of the present invention.

First, as described with reference to FIGS. 2A and 2B, a barrier layer 26 and a second sacrificial layer 27 are formed in second openings OP2. Referring to FIG. 4A, the second sacrificial layer 27 may include a void V located in the second opening OP2.

Figure 4B:
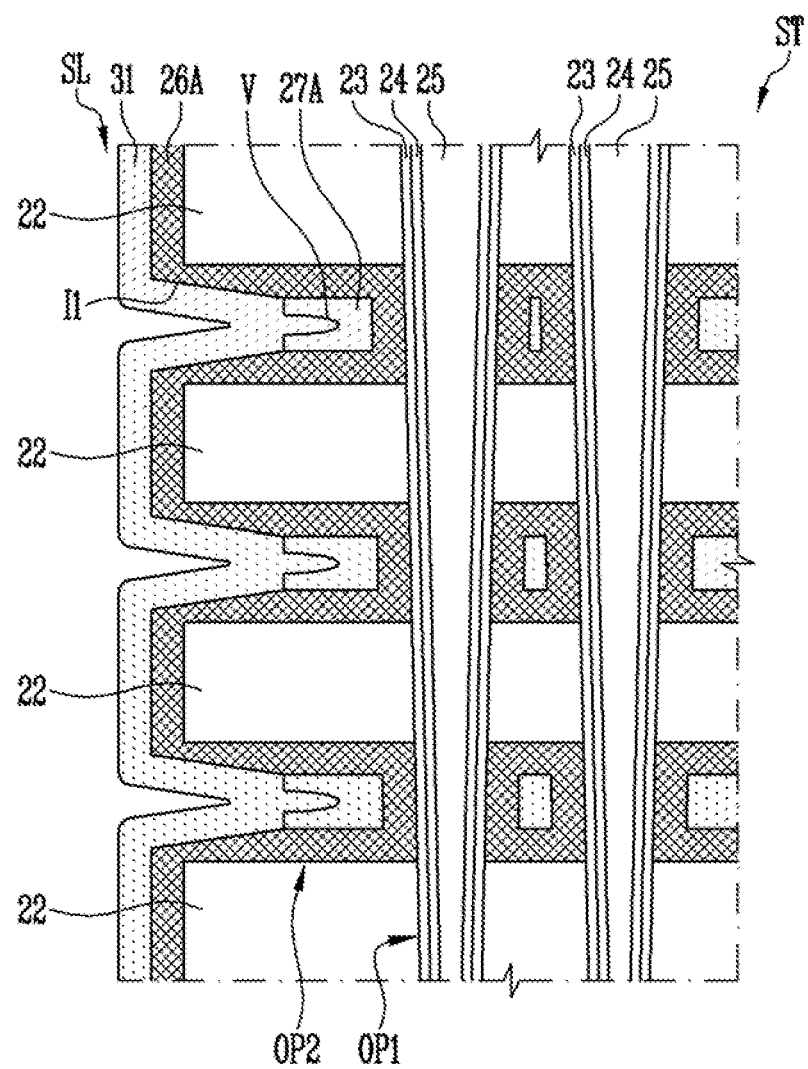

Referring to FIG. 4B, the second sacrificial layer 27 is partially removed through a slit SL, thereby forming second sacrificial patterns 27A. At this time, the void V may be exposed in the process of partially etching the second sacrificial layer 27. In addition, the barrier layer 26 may be partially etched in the process of partially etching the second sacrificial layer 27, thereby forming an inclined inner surface I1.

Subsequently, a third sacrificial layer 31 is formed in the barrier layer 26A. The third sacrificial layer 31 may be formed to fill in the void V of the second sacrificial pattern 27A. The third sacrificial layer 31 may be formed to have a thickness which is not completely filled in the second opening OP2. Here, the third sacrificial layer 31 may include a dielectric material such as oxide, nitride, silicon (Si), or combinations thereof. Also, the third sacrificial layer 31 may be formed of the same material as the second sacrificial layer 27 or a different material from the second sacrificial layer 27.

Figure 4C:
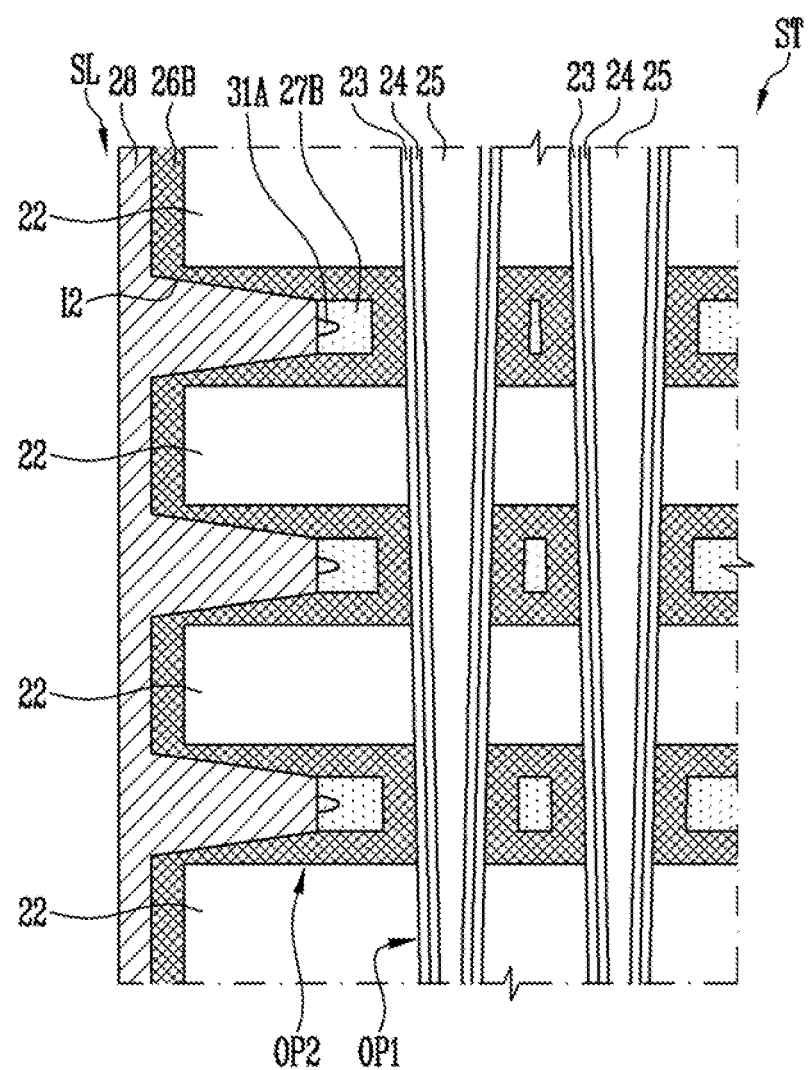

Referring to FIG. 4C, the second sacrificial patterns 27A and the third sacrificial layer 31 are partially removed, thereby forming second sacrificial patterns 27B and third sacrificial patterns 31A. At this time, the exposed barrier layer 26A may be partially etched in the process of partially etching the second sacrificial patterns 27A and the third sacrificial layer 31, thereby forming an inclined surface I2 of a barrier layer 26B.

When the second sacrificial layer 27 includes the void V, the second sacrificial layer 27 may not be etched to have a uniform thickness. For example, the region in which the void V exists may be etched faster than other regions. Thus, the second sacrificial patterns 27A and the third sacrificial layer 31 are etched after the void V is filled with the third sacrificial layer 31, so that it is possible to uniformly adjust the amount in which the second sacrificial patterns 27A and the third sacrificial layer 31 are etched. Further, it is possible to uniformly adjust the area in which the barrier layer 26B is exposed and the angle of the inclined inner surface I2 of the barrier layer 26B. For reference, the processes of forming the third sacrificial layer 31 and etching the second sacrificial patterns 27A and the third sacrificial layer 31 may be repeatedly performed twice or more.

Subsequently, a metal layer 28 is formed to fill in the second openings OP2. The metal layer 28 may contact with the second and third sacrificial patterns 27B and 31A.

Figure 4D:
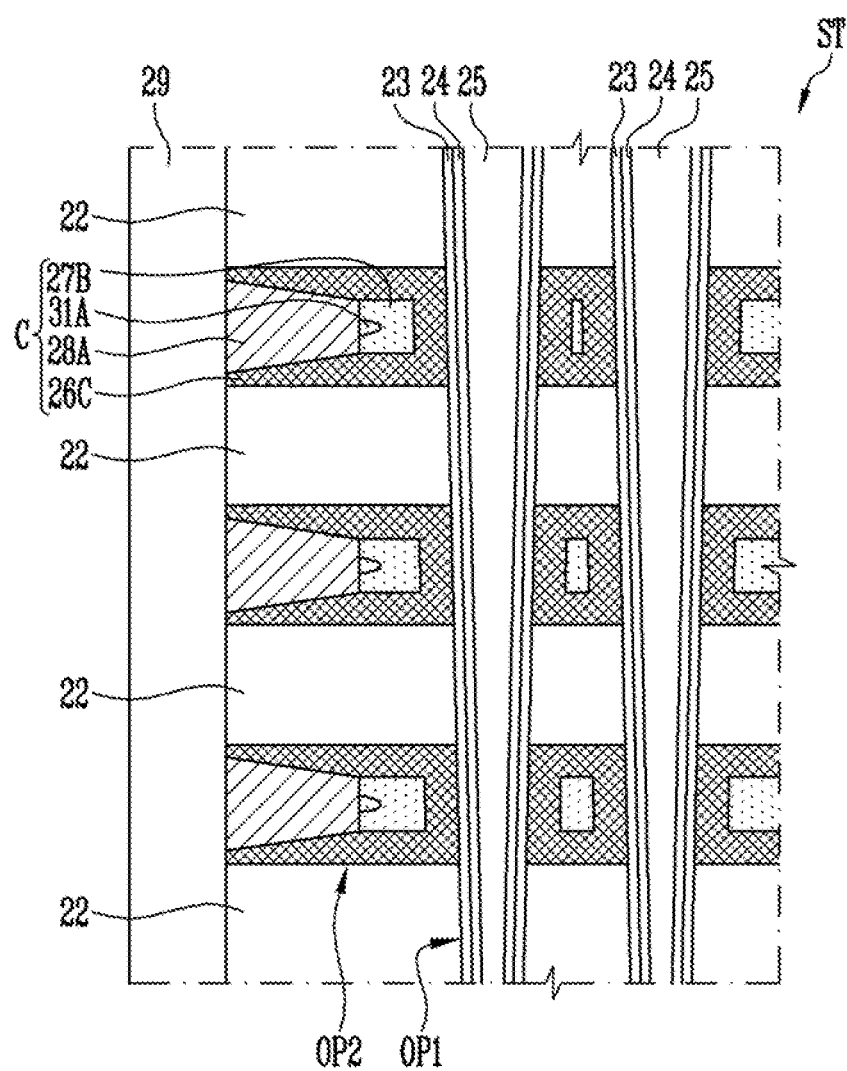

Referring to FIG. 4D, the barrier layer 26B and the metal layer 28, which are formed in the slit SL, are removed, thereby forming barrier patterns 26C and metal patterns 28A. Accordingly, conductive layers C are formed, each including the barrier pattern 26C, the second sacrificial pattern 27B, the third sacrificial pattern 31A, and the metal pattern 28A.

As described with reference to FIGS. 3A to 3C, the second sacrificial patterns 27B and the third sacrificial patterns 31A may be removed before the metal layer 28 is formed.

FIGS. 5A to 5D are sectional views illustrating a manufacturing method for a semiconductor device, according to an embodiment of the present invention. Hereinafter, contents overlapping with those described above will be omitted.

Figure 5A:
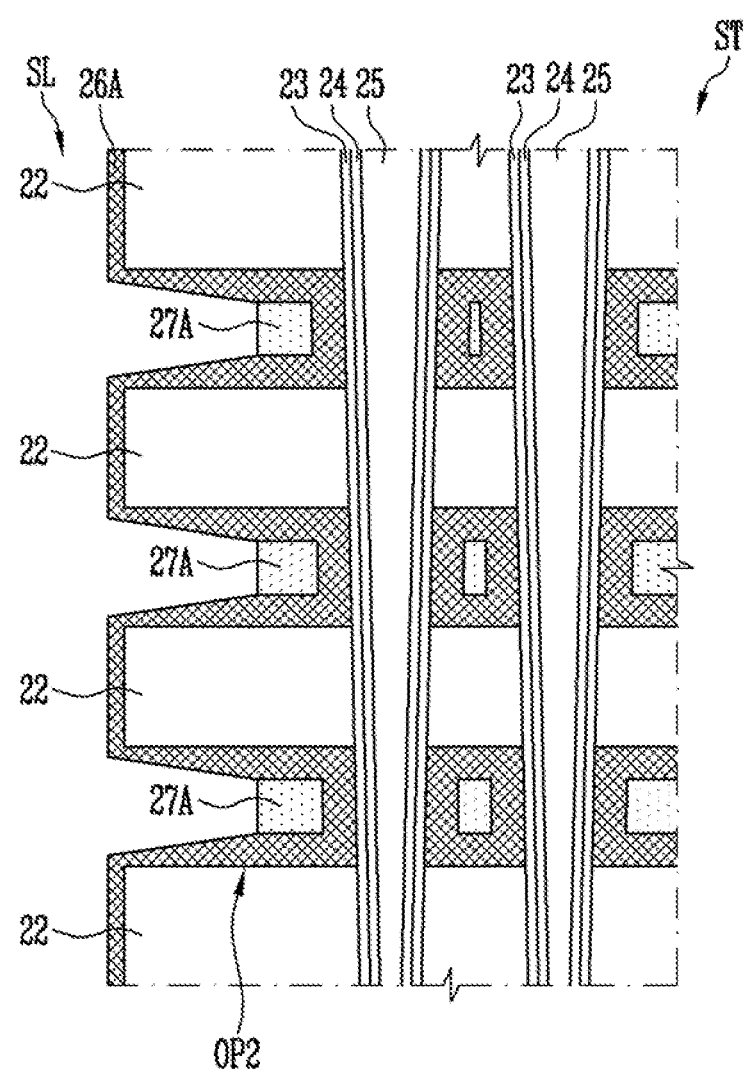
FIGS. 5A to 5D are cross-sectional views illustrating a manufacturing method for a semiconductor device, according to an embodiment of the present invention.

First, as described with reference to FIGS. 2A to 2C, a first barrier layer 26A and second sacrificial patterns 27A are formed in second openings OP2. Referring to FIG. 5A, the first barrier layer 26A is etched together in an etching process for forming the second sacrificial patterns 27A, thereby forming the first barrier layer 26A having an inner surface inclined at a predetermined angle.

Figure 5B:
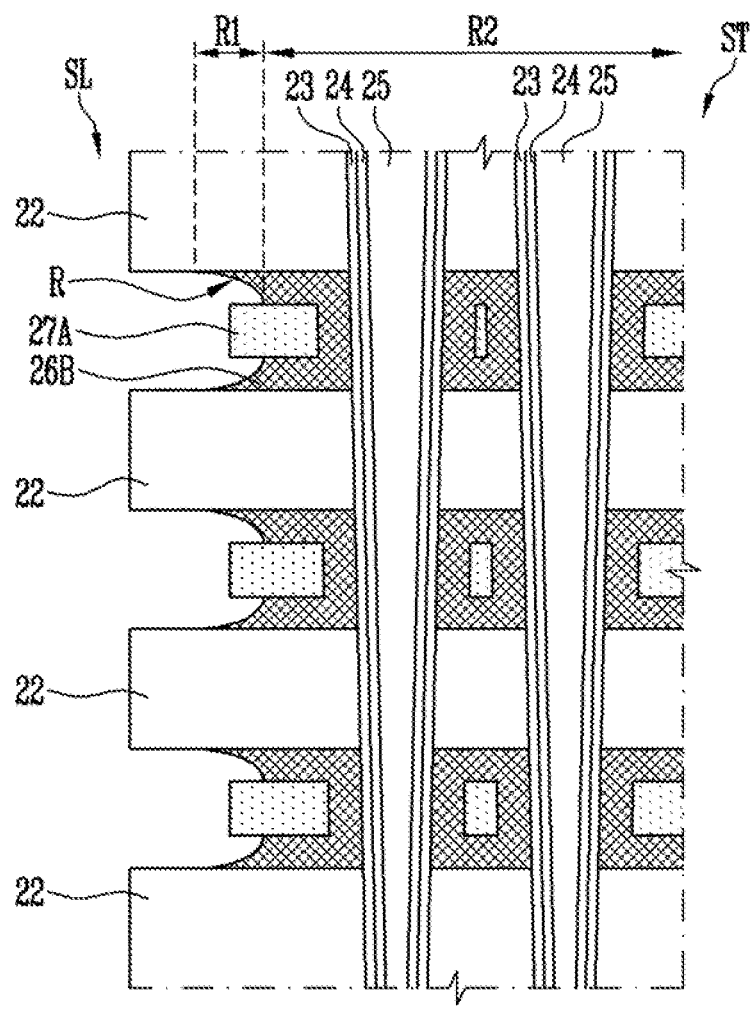

Referring to FIG. 5B, the first barrier layer 26A is selectively etched, thereby patterning the inner surface inclined at the predetermined angle to a curved surface R. Accordingly, there is formed a first barrier pattern 26B having a rounded inner surface. Here, a region having the curved surface becomes a first region R1, and a non-curved region becomes a second region R2. For example, the first barrier layer 26A may be etched using a wet etching process, thereby etching a region exposed by the second sacrificial pattern 27A in the barrier layer 26A. At this time, the etching process is performed through a slit SL, and hence the amount in which a region of the first barrier layer 26A is etched becomes larger as the region comes closer to the slit SL. Therefore, the curved surface may be formed in a parabolic shape in which its curvature becomes smaller as it comes closer to the slit SL and becomes larger as it is further away from the slit SL. In addition, as the first barrier layer 26A is completely removed in the region close to the slit SL in the second opening OP2, insulating layers 22 may be exposed. Also, at this time, the second sacrificial pattern 27A may protrude into the first region R1 of the first barrier pattern 26B.

Figure 5C:
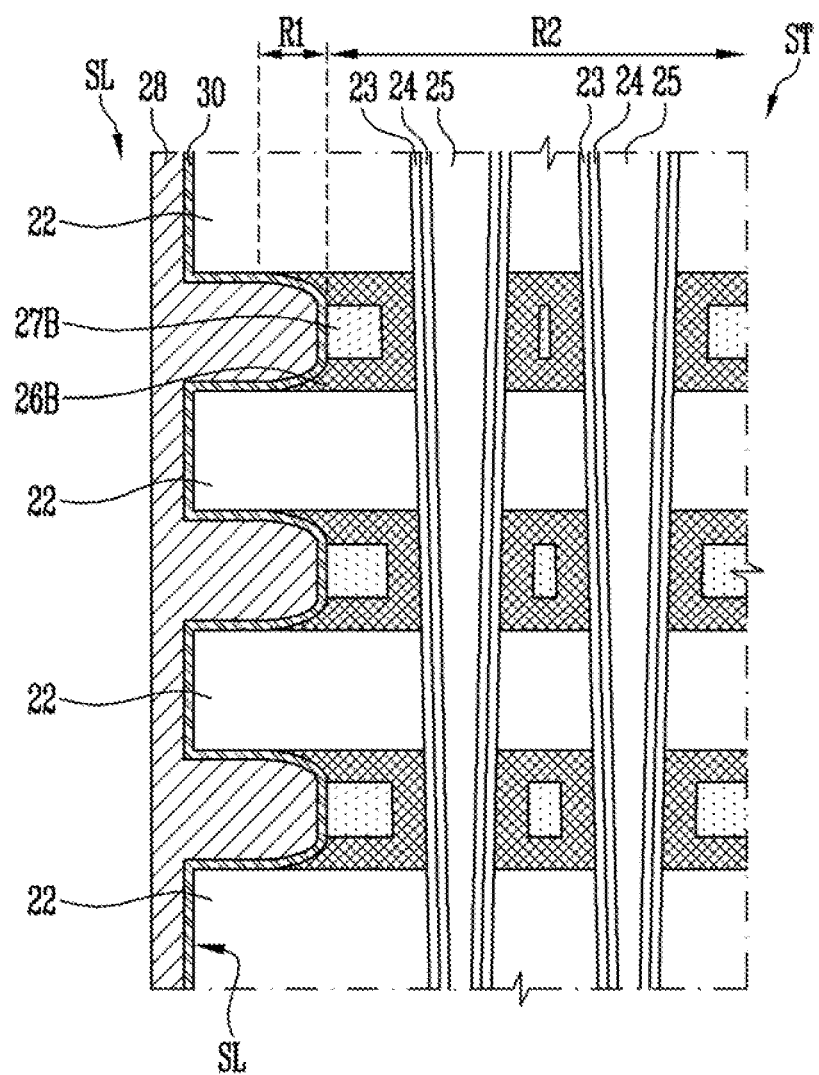

Referring to FIG. 5C, the second sacrificial pattern 27A is selectively etched, thereby removing the region protruding into the first region R1 in the first barrier pattern 26B. Accordingly, second sacrificial patterns 27B are formed. Subsequently, a second barrier layer 30 is formed in the second opening OP2 in which the first barrier pattern 26B is formed. Subsequently, a metal layer 28 is formed to fill in the second opening OP2.

Here, the second barrier layer 30 may be formed to contact the first barrier pattern 26B and the second sacrificial pattern 27B. The second barrier layer 30 may be formed of the same material as the first barrier pattern 26B. Also, the second barrier layer 30 may have a thinner thickness than the first barrier pattern 26B. The second barrier layer 30 may be formed to have a uniform thickness. For reference, the process of selectively etching the second sacrificial 27A may be omitted.

Figure 5D:
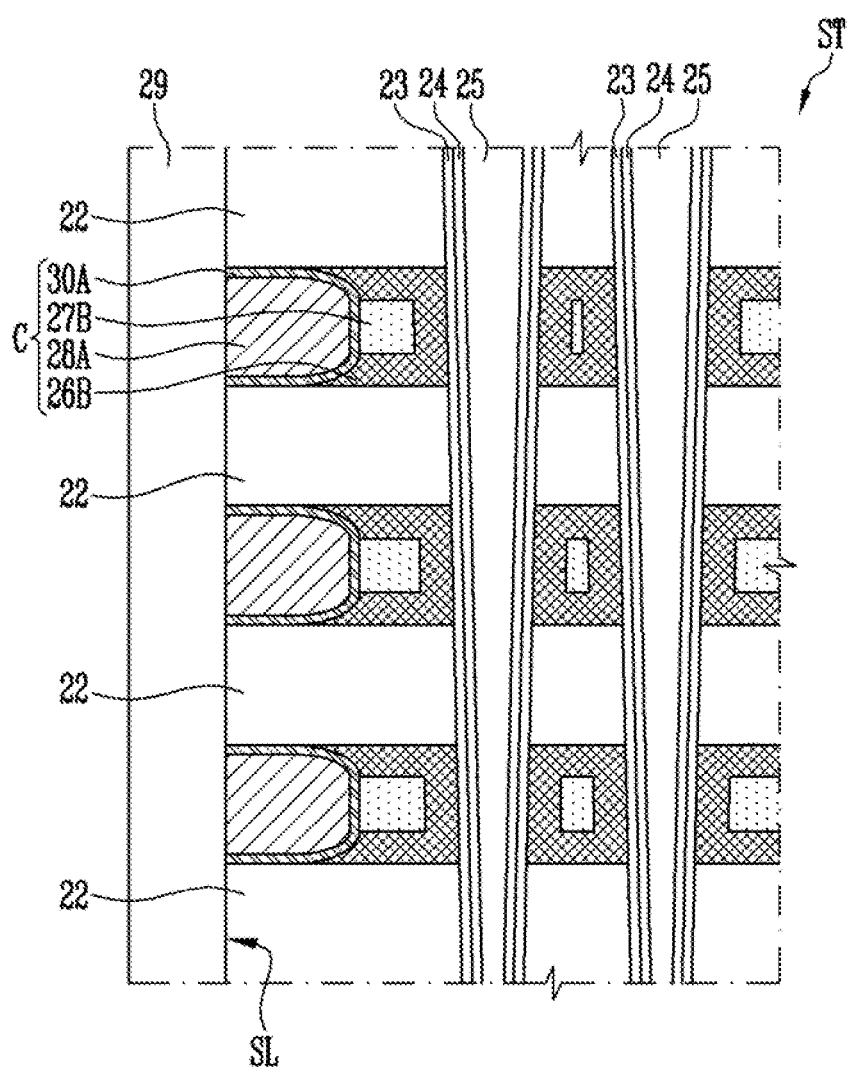

Referring to FIG. 5D, the metal layer 28 and the second barrier layer 30 in the slit SL are etched, thereby forming second barrier patterns 30A and metal patterns 28A. Accordingly, there are formed conductive layers C each including the first barrier pattern 26B having a rounded inner surface. Subsequently, a slit insulating layer 29 is formed in the slit SL.

Figure 6:
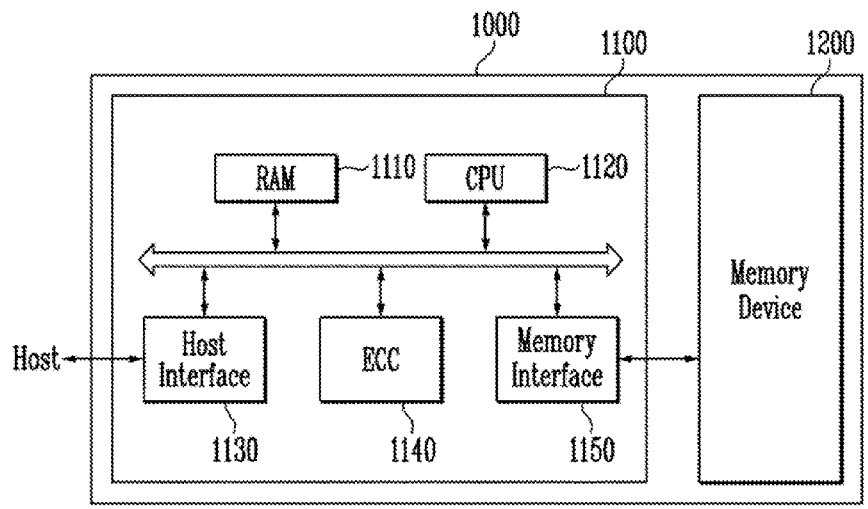
FIGS. 6 and 7 are simplified block diagrams illustrating configurations of memory systems, according to embodiments of the present invention.

FIG. 6 is a block diagram illustrating a configuration of a memory system, according to an embodiment of the present invention.

Referring to FIG. 6, the memory system 1000 according to the embodiment of the present invention includes a memory device 1200 and a controller 1100.

The memory device 1200 is used to store data information having various data formats, such as texts, graphics, and software codes. The memory device 1200 may be a non-volatile memory, and may include the structures described with reference to FIGS. 1A to 5D. The memory device 1200 is configured to include: a stack structure including conductive layers and insulating layers, which are alternately stacked; channel patterns penetrating the stack structure; and a slit penetrating the stack structure, wherein each of the conductive layers includes a barrier pattern having an inclined inner surface and a metal pattern in the barrier pattern. The structure and manufacturing method for the memory device 1200 may be the same as described above, and therefore, their detailed descriptions will be omitted.

The controller 1100 is connected to a host and the memory device 1200 and configured to access the memory device 1200 in response to a request from the host. For example, the controller 1100 is configured to control at least one of a reading, writing, erasing, and background operations of the memory device 1200.

The controller 1100 includes a random access memory (RAM) 1110, a central processing unit (CPU) 1120, a host interface 1130, an error correction code (ECC) circuit 1140, a memory interface 1150, and the like, coupled via an internal bus.

Here, the RAM 1110 may be used as an operation memory of the CPU 1120, a cache memory between the memory device 1200 and the host, and a buffer memory between the memory device 1200 and the host. For example, the RAM 1110 may be replaced with a static random access memory (SRAM), a read only memory (ROM), and the like.

The CPU 1120 is configured to control the operations of the controller 1100. For example, the CPU 1120 may be configured to operate a firmware, such as a flash translation layer (FTL) stored in the RAM 1110.

The host interface 1130 is configured to interface with the host. For example, the controller 1100 communicates with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The ECC circuit 1140 is configured to detect and correct an error included in data that is read from the memory device 1200, using an error correction code (ECC).

The memory interface 1150 may be configured to interface with the memory device 1200. For example, the memory interface 1150 may include an NAND interface or a NOR interface.

For reference, the controller 1100 may further include a buffer memory (not shown) for temporarily storing data. Here, the buffer memory may be used to temporarily store data transferred to the outside through the host interface 1130 or data transferred from the memory device 1200 through the memory interface 1150. The controller 1100 may further include a ROM that stores code data for interfacing with the host.

As described above, the memory system 1000 according to the embodiment of the present invention includes transistors having uniform characteristics and the memory device 1200 having an improved degree of integration. Thus, it is possible to improve characteristics of the memory system 1000 and the degree of integration of the memory system 1000.

Figure 7:
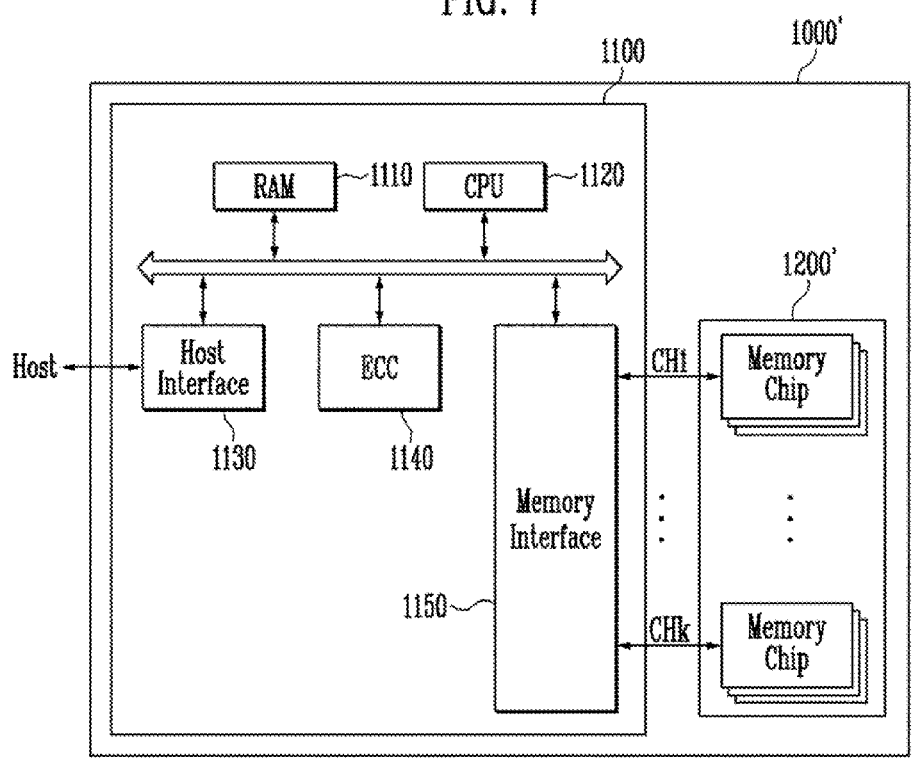

FIG. 7 is a block diagram illustrating a configuration of a memory system according to an embodiment of the present invention. Hereinafter, description of contents overlapping with those described above will be omitted.

Referring to FIG. 7, the memory system 1000' according to the embodiment of the present invention includes a memory device 1200' and a controller 1100. The controller 1100 may include a RAM 1110, a CPU 1120, a host interface 1130, an ECC circuit 1140, a memory interface 1150, all linked via an internal bus.

The memory device 1200' may be a nonvolatile memory, and may include the structures described with reference to FIGS. 1A to 5D. The memory device 1200' is configured to include: a stack structure including conductive layers and insulating layers, which are alternately stacked; channel patterns penetrating the stack structure; and a slit penetrating the stack structure, wherein each of the conductive layers includes a barrier pattern having an inclined inner surface and a metal pattern in the barrier pattern. The structure and manufacturing method of the memory device 1200' are the same as described above, and therefore, their detailed descriptions will be omitted.

The memory device 1200' may be a multi-chip package including a plurality of memory chips. The plurality of memory chips are divided into a plurality of groups, which are configured to communicate with the controller 1100 over first to kth channels (CH1 to CHk). In addition, memory chips included in one group may be configured to communicate with the controller 1100 over a common channel. For reference, the memory system 1000' may be modified so that one memory chip is connected to one channel.

As described above, the memory system 1000' according to the embodiment of the present invention includes transistors having uniform characteristics and the memory device 1200' having an improved degree of integration. Thus, it is possible to improve characteristics of the memory system 1000' and the degree of integration of the memory system 1000'. Particularly, the memory device 1200' is configured as a multi-chip package, so that it is possible to increase the data storage capacity of the memory system 1000' and to improve the operation speed of the memory system 1000'.

Figure 8:
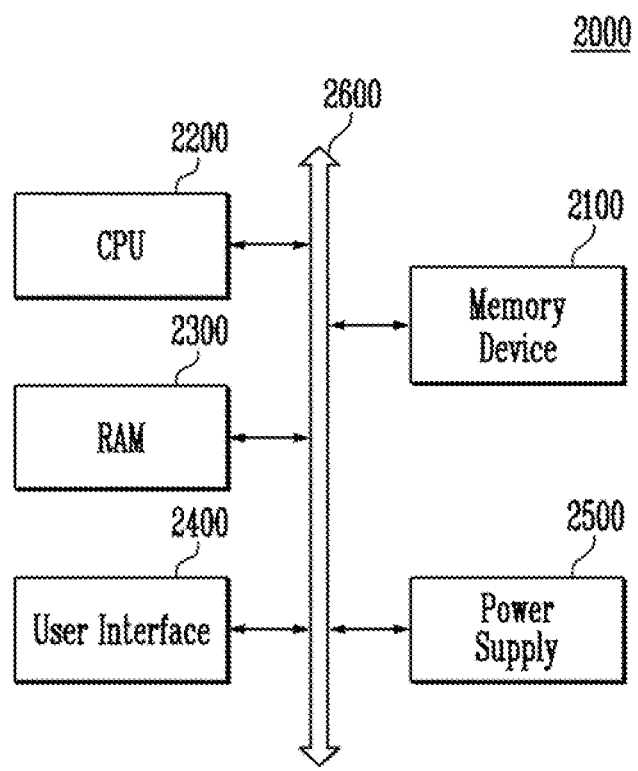
FIGS. 8 and 9 are block diagrams illustrating computing systems, according to embodiments of the present invention.

FIG. 8 is a block diagram illustrating a configuration of a computing system according to an embodiment of the present invention. Hereinafter, description of contents overlapping with those described above will be omitted.

As shown in FIG. 8, the computing system 2000 according to the embodiment of the present invention includes a memory device 2100, a CPU 2200, a RAM 2300, a user interface 2400, a power source 2500, a system bus 2600, and the like.

The memory device 2100 stores data provided through the user interface 2400, data processed by the CPU 2200, and the like. In addition, the memory device 2100 is electrically connected to the CPU 2200, the RAM 2300, the user interface 2400, the power source 2500, and the like through the system bus 2600. For example, the memory device 2100 may be connected to the system bus 2600 through a controller (not shown) or directly. When the memory device 2100 is directly connected to the system bus 2600, a function of the controller may be performed by the CPU 2200, the RAM 2300, etc.

Here, the memory device 2100 may be a nonvolatile memory, and may include the structures described with reference to FIGS. 1A to 5D. In addition, the memory device 2100 is configured to include: a stack structure including conductive layers and insulating layers, which are alternately stacked; channel patterns penetrating the stack structure; and a slit penetrating the stack structure, wherein each of the conductive layers includes a barrier pattern having an inclined inner surface and a metal pattern in the barrier pattern. The structure and manufacturing method of the memory device 2100 are the same as described above, and therefore, their detailed descriptions will be omitted.

The memory device 2100 may be a multi-chip package including a plurality of memory chips as described with reference to FIG. 7.

The computing system 2000 configured as described above may be a computer, a ultra mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for communicating information in a wireless environment, one of a variety of electronic devices constituting a home network, one of a variety of electronic devices constituting a computer network, one of a variety of electronic devices constituting a telematics network, an RFID device, and the like.

As described above, the computing system 2000 according to the embodiment of the present invention includes transistors having uniform characteristics and the memory device 2100 having an improved degree of integration. Thus, it is possible to improve characteristics of the computing system 2000 and the degree of integration of the computing system 2000.

Figure 9:
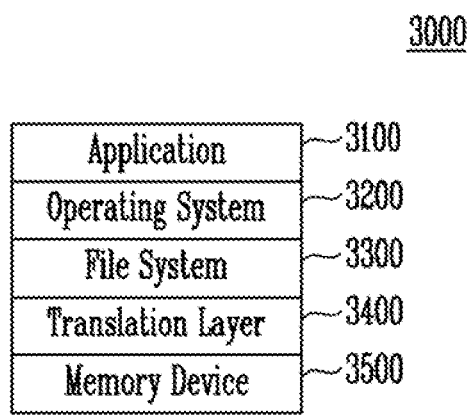

FIG. 9 is a block diagram illustrating a computing system 3000, according to an embodiment of the present invention.

Referring to FIG. 9, the computing system 3000 includes a software layer including an operating system 3200, an application 3100, a file system 3300, and a translation layer 3400. In addition, the computing system 3000 includes a hardware layer of a memory device 3500.

The operating system 3200 may manage the software and hardware resources of the computing system 3000, and control program execution of a central processing unit. The application 3100 is one of a variety of application programs running on the computing system 3000, and may be a utility executed by the operating system 3200.

The file system 3300 may be a logical structure for managing data, files, and the like in the computing system 3000, and organizing the data or files stored in the memory device 3500 according to a rule. The file system 3300 may be determined depending on the operating system 3200 used in the computing system 3000. For example, when the operating system 3200 is a Windows operating system of Microsoft, the file system 3300 may be a file allocation table (FAT) or an NT file system (NTFS). When the operating system 3200 is a Unix/Linux operating system, the file system 3300 may be an extended file system (EXT), a Unix file system (UFS), or a journaling file system (JFS).

In this drawing, the operating system 3200, the application 3100, and the file system 3300 are shown as individual blocks. However, the application 3100 and the file system 3300 may be included in the operating system 3200.

The translation layer 3400 translates an address into a form suitable for the memory device 3500 in response to a request from the file system 3300. For example, the translation layer 3400 may translate a logical address generated by the file system 3300 into a physical address of the memory device 3500. Here, mapping information between the logical address and the physical address may be stored as an address translation table. For example, the translation layer 3400 may be a flash translation layer (FTL), a universal flash storage link layer (ULL), and the like.

The memory device 3500 may be a nonvolatile memory, and may include the structures described with reference to FIGS. 1A to 5D. In addition, the memory device 3500 is configured to include: a stack structure including conductive layers and insulating layers, which are alternately stacked; channel patterns penetrating the stack structure; and a slit penetrating the stack structure, wherein each of the conductive layers includes a barrier pattern having an inclined inner surface and a metal pattern in the barrier pattern. The structure and manufacturing method of the memory device 3500 are the same as described above, and therefore, their detailed descriptions will be omitted.

The computing system 3000 configured as described above may be divided into an operating system layer performed in an upper level region and a controller layer performed in a lower level region. Here, the application 3100, the operating system 3200, and the file system 3300 are included in the operating system layer, and may be driven by the operation memory of the computing system 3000. In addition, the translation layer 3400 may be included in the operating system layer or the controller layer.

As described above, the computing system 3000 according to the embodiment of the present invention includes transistors having uniform characteristics and the memory device 3500 having an improved degree of integration. Thus, it is possible to improve characteristics of the computing system 3000 and the data storage capacity of the computing system 3000.

According to embodiments of the present invention, each of the stacked conductive layers includes a barrier pattern having an inclined inner surface and a metal pattern in the barrier pattern. In addition, the barrier pattern has a shape in which its thickness decreases as it comes close to a slit, and the metal pattern has a shape in which its thickness increases at it comes close to the slit. Thus, it is possible to increase the volume of the metal pattern included in the conductive layer. Accordingly, it is possible to improve the loading characteristics of the semiconductor device. Further, the barrier pattern having the inclined inner surface can be readily and reliably formed using a process including etching of a sacrificial layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. It will be understood by those of skill in the art that various changes in form and details may be made without departing from the spirit and scope of the present invention as set forth in the following claims.

What is claimed is:

1. A semiconductor device comprising:
a stack structure including conductive layers and insulating layers, which are alternately stacked, each of the conductive layers including a first barrier pattern having an inclined inner surface and a metal pattern in the first barrier pattern; and
channel patterns penetrating the stack structure.

2. The semiconductor device of claim 1, further comprising
a slit spaced apart from the channel patterns and penetrating the stack structure.

3. The semiconductor device of claim 2, wherein the first barrier pattern includes a first region having the inclined inner surface and a second region having a non-inclined inner surface.

4. The semiconductor device of claim 3, wherein the first region is located closer to the slit than the second region.

5. The semiconductor device of claim 3,
wherein the thickness of the first region decreases as the first region approaches the slit.

6. The semiconductor device of claim 3, wherein the second region of the first barrier pattern has a uniform thickness.

7. The semiconductor device of claim 3, wherein the metal pattern has a uniform thickness in the second region, and the thickness of the metal pattern increases as the metal pattern approaches the slit in the first region.

8. The semiconductor device of claim 3, wherein the first region of the first barrier pattern is inclined at a predetermined angle.

9. The semiconductor device of claim 3, wherein the inner surface of the first region of the first barrier pattern is a curved surface.

10. The semiconductor device of claim 3, wherein the inner surface of the first region of the first barrier pattern is a curved surface having a curvature, which decreases as the first region approaches the slit.

11. The semiconductor device of claim 3, wherein each of the conductive layers includes the metal pattern located in the first region of the first barrier pattern and a sacrificial pattern located in a second region of the first barrier pattern.

12. The semiconductor device of claim 11, wherein the sacrificial pattern is filled in spaces between adjacent channel patterns.

13. The semiconductor device of claim 2, wherein the metal pattern has a tapered shape in which a thickness thereof increases as the metal pattern approaches the slit.

14. The semiconductor device of claim 2, wherein the first barrier pattern has a flat outer surface.

15. A semiconductor device comprising:
a stack structure including conductive layers and insulating layers, which are alternately stacked, each of the conductive layers including a first barrier pattern having an inclined inner surface and a metal pattern in the first barrier pattern,
wherein each of the conductive layers includes a second barrier pattern surrounding the metal pattern, the second barrier pattern being interposed between the metal pattern and the first barrier pattern.

16. The semiconductor device of claim 15, wherein the second barrier pattern has a thinner thickness than the first barrier pattern.

17. A semiconductor device comprising:
a stack structure including conductive layers and insulating layers, which are alternately stacked, each of the conductive layers including a barrier pattern and a metal pattern in the barrier pattern,
wherein the barrier pattern has a flat outer surface parallel to surfaces of the insulating layers and an inclined inner surface so that the barrier pattern has a varying thickness along the inclined inner surface.

18. The semiconductor device of claim 17, further comprising:
channel patterns penetrating the stack structure.

19. The semiconductor device of claim 18, wherein the barrier pattern includes a first region and a second region, the first region is closer to the channel patterns than the second region, and the second region is thinner than the first region.

20. The semiconductor device of claim 18, further comprising:
a slit spaced apart from the channel patterns and penetrating the stack structure,
wherein the barrier pattern gets thinner from the channel patterns toward the slit.

* * * * *